US012563722B2

(12) United States Patent
Chang et al.

(10) Patent No.: US 12,563,722 B2
(45) Date of Patent: Feb. 24, 2026

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Meng-Sheng Chang, Hsinchu (TW); Yao-Jen Yang, Hsinchu (TW); Shao-Tung Peng, Hsinchu (TW); Chung-I Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 310 days.

(21) Appl. No.: 18/165,296

(22) Filed: Feb. 6, 2023

(65) Prior Publication Data

US 2024/0268107 A1    Aug. 8, 2024

(51) Int. Cl.
*H10B 20/25* (2023.01)
(52) U.S. Cl.
CPC ................................... *H10B 20/25* (2023.02)
(58) Field of Classification Search
CPC ...................................................... H10B 20/25
See application file for complete search history.

(56) References Cited

U.S. PATENT DOCUMENTS

| | | | |
|---|---|---|---|
| 11,257,757 B2 * | 2/2022 | Chang ..................... | G06F 30/39 |
| 2013/0183802 A1 | 7/2013 | Kim | |
| 2019/0109089 A1 | 4/2019 | Kim et al. | |

FOREIGN PATENT DOCUMENTS

TW            201939510            10/2019

* cited by examiner

*Primary Examiner* — Allison Bernstein
(74) *Attorney, Agent, or Firm* — Hauptman Ham, LLP

(57) ABSTRACT

An integrated circuit includes a first active region, a second active region, a first fuse and a dummy fuse. The first active region extends in a first direction, and is on a first level. The second active region extends in the first direction, is on the first level, and is separated from the first active region in a second direction different from the first direction. The first fuse extends in the first direction, is on a second level, overlaps the first active region and is electrically coupled to the first active region. The dummy fuse extends in the first direction, is on the second level, and is separated from the first fuse in the second direction. The dummy fuse overlaps the second active region, and is not electrically coupled to the second active region.

20 Claims, 18 Drawing Sheets

100A

100B

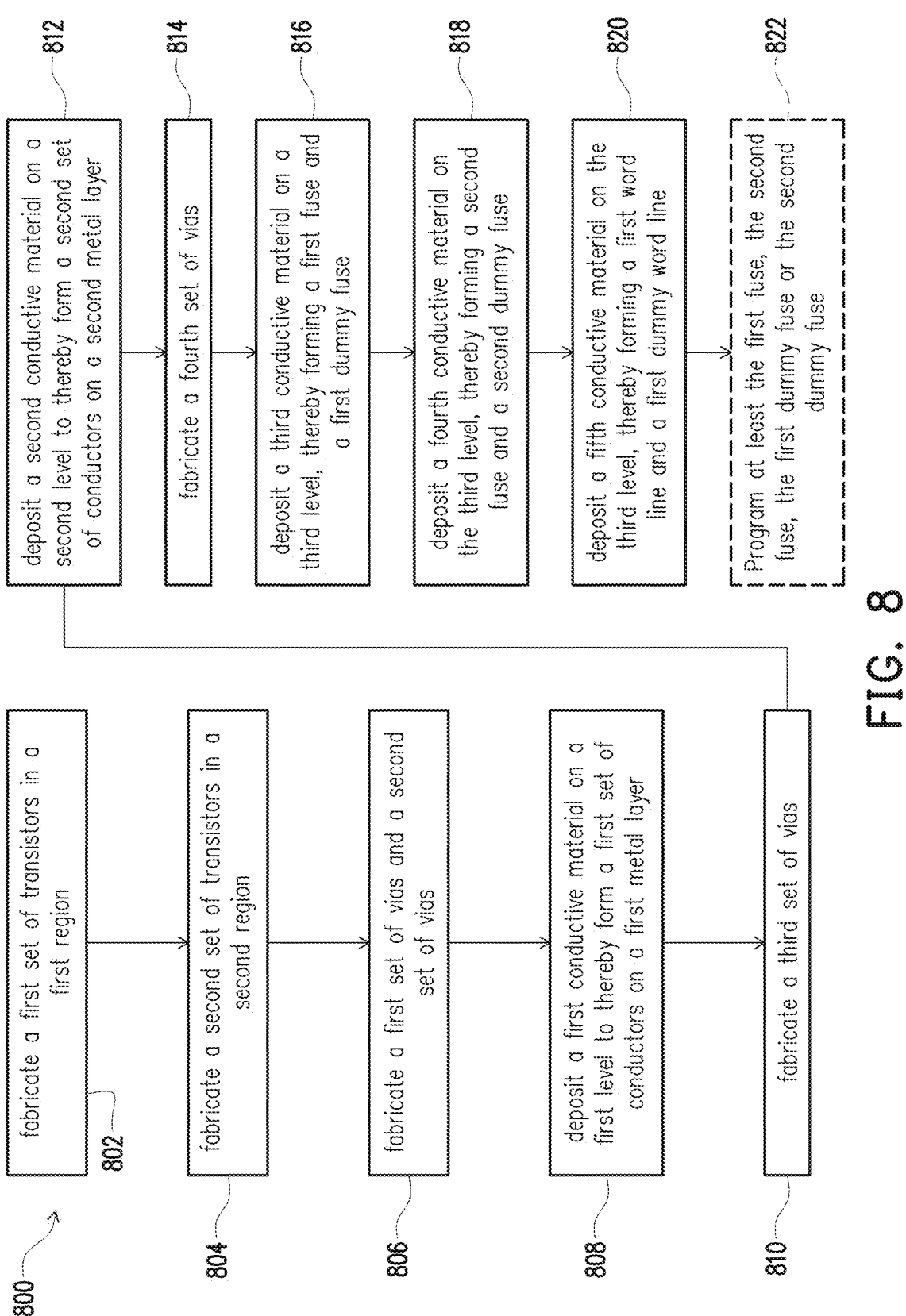

812 — deposit a second conductive material on a second level to thereby form a second set of conductors on a second metal layer 814 — fabricate a fourth set of vias 816 — deposit a third conductive material on a third level, thereby forming a first fuse and a first dummy fuse 818 — deposit a fourth conductive material on the third level, thereby forming a second fuse and a second dummy fuse 820 — deposit a fifth conductive material on the third level, thereby forming a first word line and a first dummy word line 822 — Program at least the first fuse, the second fuse, the first dummy fuse or the second dummy fuse 802 — fabricate a first set of transistors in a first region 804 — fabricate a second set of transistors in a second region 806 — fabricate a first set of vias and a second set of vias 808 — deposit a first conductive material on a first level to thereby form a first set of conductors on a first metal layer 810 — fabricate a third set of vias

Generate a layout design of an integrated circuit — 902

Manufacture the integrated circuit based on the layout design — 904

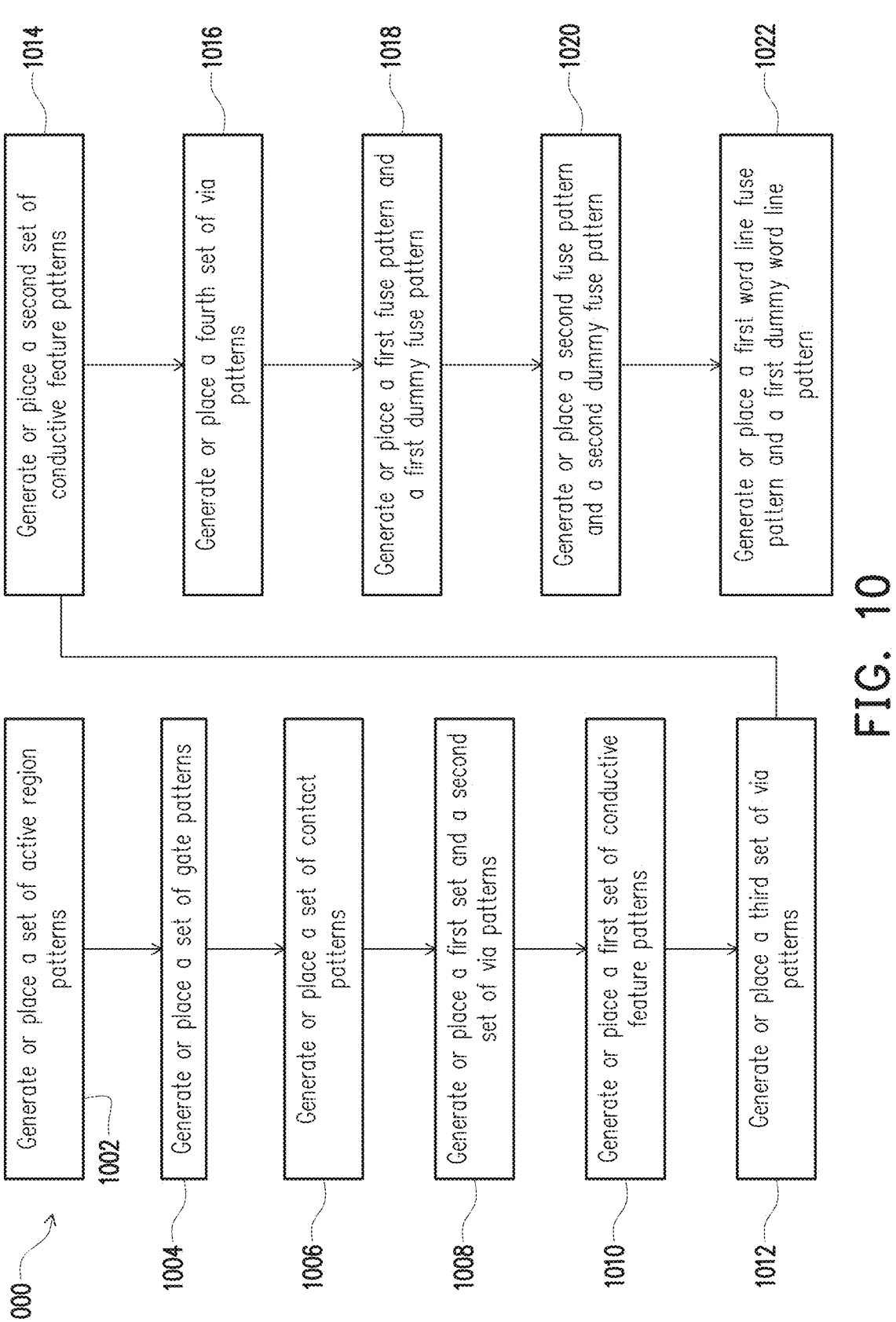

1000

1002

1004 Generate or place a set of active region patterns

1006 Generate or place a set of gate patterns

1008 Generate or place a set of contact patterns

1010 Generate or place a first set and a second set of via patterns

1012 Generate or place a first set of conductive feature patterns

Generate or place a third set of via patterns

1014 Generate or place a second set of conductive feature patterns

1016 Generate or place a fourth set of via patterns

1018 Generate or place a first fuse pattern and a first dummy fuse pattern

1020 Generate or place a second fuse pattern and a second dummy fuse pattern

1022 Generate or place a first word line fuse pattern and a first dummy word line pattern

FIG. 10

INTEGRATED CIRCUIT AND METHOD OF FORMING THE SAME

BACKGROUND

Manufacturing processes utilize fuses in an interconnect structure to selectively alter electrical connections within a semiconductor device. By blowing selected fuses within the semiconductor device, a function of the semiconductor device is tailored to a desired functionality. Utilizing fuses to adjust the functionality of the semiconductor device permits a manufacturer of the semiconductor device to form a same structure for a wide variety of products and then selectively blow the fuses in order to impart the desired functionality to the semiconductor device. This helps to increase production efficiency.

In some instances, a competitor may seek to reverse engineer a manufactured product by analyzing the functionality of the semiconductor device. During the attempted reverse engineering, a grinding or planarization process is performed on the semiconductor device to expose a conductive level having the fuses and identifying which of the fuses remain intact and which of the fuses are blown. Identifying the state of the fuses within the semiconductor device assists in reverse engineering of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flow chart of a method of forming or manufacturing an integrated circuit in accordance with some embodiments.

FIG. 10 is a flowchart of a method of generating a layout design of an integrated circuit in accordance with some embodiments.

DETAILED DESCRIPTION

Figure 1A:
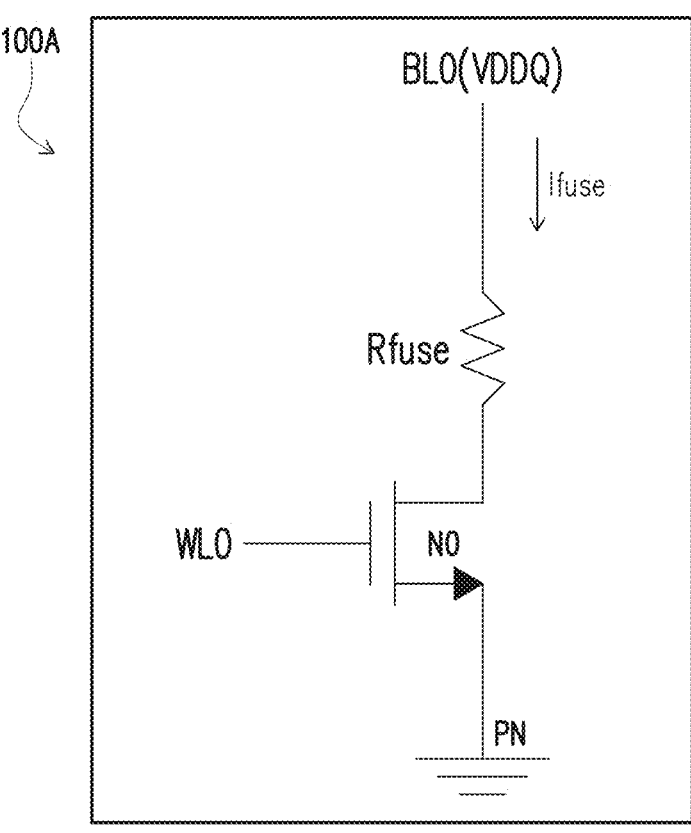
FIGS. 1A-1B are corresponding circuit diagrams of corresponding eFuse circuits, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first active region extending in a first direction. In some embodiments, the first active region is on a first level.

In some embodiments, the integrated circuit further includes a second active region extending in the first direction.

In some embodiments, the second active region is on the first level, and is separated from the first active region in a second direction. In some embodiments, the second direction is different from the first direction.

In some embodiments, the integrated circuit further includes a first fuse extending in the first direction. In some embodiments, the first fuse is on a second level. In some embodiments, the first fuse overlaps the first active region and is electrically coupled to the first active region.

In some embodiments, the integrated circuit further includes a dummy fuse extending in the first direction. In some embodiments, the dummy fuse is on the second level. In some embodiments, the dummy fuse is separated from the first fuse in the second direction. In some embodiments, the dummy fuse overlaps the second active region, and is not electrically coupled to the second active region.

In some embodiments, the first fuse and the dummy fuse are an array of fuses. In some embodiments, by including the first fuse and the dummy fuse in the array of fuses, the integrated circuit increases the difficulty of decrypting codes associated with the first fuse and the dummy fuse in the integrated circuit, thereby resulting in enhanced security of the locations of one or more fuses or dummy fuses in the integrated circuit and corresponding codes associated with each fuse/bit cell compared to other approaches.

In some embodiments, by enhancing the security of the locations of one or more fuses or dummy fuses in the integrated circuit, reverse engineering of the integrated circuit becomes more difficult and increases the amount of time and money utilized to identify which of the fuses are dummy fuses in the integrated circuit.

Figure 1B:
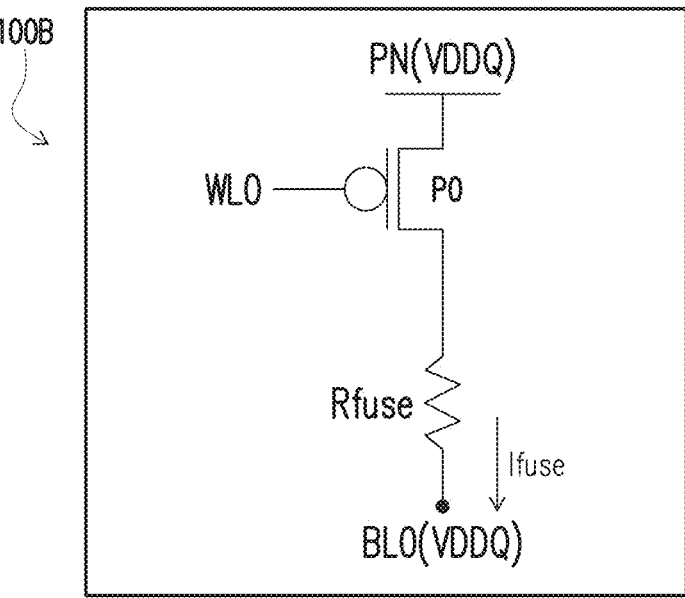

FIGS. 1A-1B are corresponding circuit diagrams of corresponding eFuse circuits 100A-100B, in accordance with some embodiments.

Circuit 100A includes an eFuse Rfuse coupled between a program node PN and a bit line BL0.

Circuit 100A further includes an n-type metal-oxide semiconductor (NMOS) transistor N0 coupled between the eFuse Rfuse and the program node PN.

A gate of NMOS transistor N0 is coupled with a word line WL0. The gate of NMOS transistor N0 is configured to receive a word line signal from the word line WL0.

Two or more circuit elements are considered to be coupled based on a direct electrical connection, a resistive or reactive electrical connection, or an electrical connection that includes one or more additional circuit elements and is thereby capable of being controlled, e.g., made resistive or open by a transistor or other switching device.

A source of NMOS transistor N0 is coupled with the program node PN. In some embodiments, the program node PN is coupled to a reference voltage supply VSS. A voltage of the reference voltage supply VSS is a reference voltage VSS'.

A drain of NMOS transistor N0 is coupled with a first end of the eFuse Rfuse. A second end of the eFuse Rfuse is coupled with the bit line BL0. In some embodiments, the bit line BL0 is coupled to a voltage supply VDDQ. The voltage of the voltage supply VDDQ is a voltage VDDQ'. In some embodiments, the bit line BL0 is configured to supply a current Ifuse.

Circuit 100B is a variation of circuit 100A. In comparison with circuit 100A, a p-type metal-oxide semiconductor (PMOS) transistor P0 replaces the NMOS transistor N0, and similar detailed description is therefore omitted.

Circuit 100B includes the PMOS transistor P0 coupled between the eFuse Rfuse and the program node PN.

A gate of PMOS transistor P0 is coupled with the word line WL0. The gate of PMOS transistor P0 is configured to receive the word line signal from the word line WL0.

A source of PMOS transistor P0 is coupled with the program node PN. In some embodiments, the program node PN is coupled to the voltage supply VDDQ.

A drain of PMOS transistor P0 is coupled with the first end of the eFuse Rfuse. A second end of the eFuse Rfuse is coupled with the bit line BL0. In some embodiments, the bit line BL0 is coupled to the reference voltage supply VSS. In some embodiments, the bit line BL0 is configured to receive current Ifuse.

In some embodiments, circuit 100A-100B is some or all of a bit cell of a plurality of bit cells in which each bit cell is coupled with bit line BL0. In some embodiments, bit line BL0 is one bit line of a plurality of bit lines. In some embodiments, a circuit 100A-100B is some or all of a bit cell of a plurality of bit cells of a memory circuit (not shown).

In some embodiments, the word line WL0 is a word line of a memory circuit, and word line signals are configured to select a bit cell including a circuit 100A-100B in a programming or a read operation. In some embodiments, a memory circuit includes one or more sense amplifiers (not shown) configured to determine a programmed state of a circuit 100A-100B in a read operation.

EFuse Rfuse is a circuit device including a conductive element capable of being sustainably altered, and thereby programmed, by a current Ifuse having a magnitude that exceeds a predetermined current level. In some embodiments, in a non-programmed state, eFuse Rfuse has a small resistance relative to a resistance in a programmed state.

Each of NMOS transistor N0 and PMOS transistor P0 is a program device in an IC device that is capable of switching between conductive and resistive states responsive to an input signal, e.g., word line signal, received at a word line WL0. In a conductive state, the program device has a low resistance current path between two current path terminals (not labeled), and, in a resistive state, the program device has a high resistance current path between the two current path terminals.

In the conductive state, the program device is capable of having the low resistance current path only for current values up to a predetermined current saturation level, and has a significantly higher relative resistance path for current values above the saturation level. In operation, the program device thereby acts to limit the value of a current flowing between the two current path terminals in response to an increasing voltage difference across the two current path terminals.

While FIG. 1A shows the program device as NMOS transistor N0, and FIG. 1B shows the program device as PMOS transistor P0, in various embodiments, the program device includes a transmission gate, a MOS transistor, a field effect transistor (FET), a FinFET, a bipolar transistor, or other suitable IC device capable of switching between conductive and resistive states responsive to an input signal.

In the embodiment depicted in FIG. 1A, NMOS transistor N0 is configured to be in the conductive state responsive to the word line signal having a high logic level, and to be in the resistive state responsive to the word line signal having a low logic level.

In the embodiment depicted in FIG. 1B, PMOS transistor P0 is configured to be in the conductive state responsive to the word line signal having the low logic level, and to be in the resistive state responsive to the word line signal having the high logic level.

Other configurations, other number of fuse elements or other number of transistors in circuit 100A or 100B are within the scope of the present disclosure. For example, at least circuit 100A or 100B includes more than 1 fuse element (e.g., eFuse Rfuse). For example, at least circuit 100A or 100B includes more than 1 programming device (e.g., NMOS transistor N0 or PMOS transistor P0).

FIGS. 2A-2F are diagrams of an integrated circuit, in accordance with some embodiments.

Integrated circuit 200 is an embodiment of at least circuit 100A or 100B, and similar detailed description is omitted for brevity.

Figure 2A:
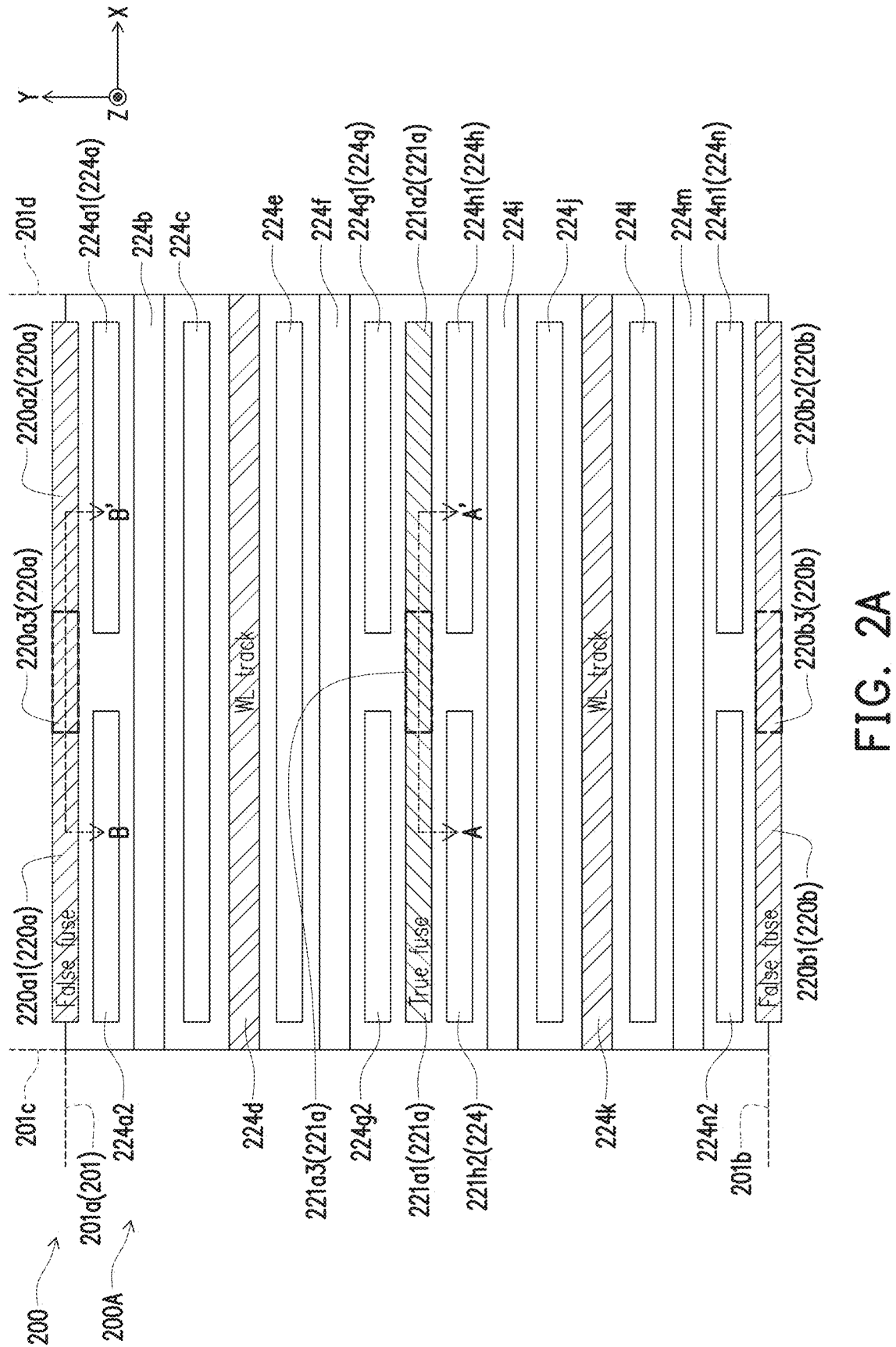
FIGS. 2A-2F are diagrams of an integrated circuit, in accordance with some embodiments.

FIG. 2A is a top view of a portion 200A of an integrated circuit 200, simplified for ease of illustration.

Figure 2B:
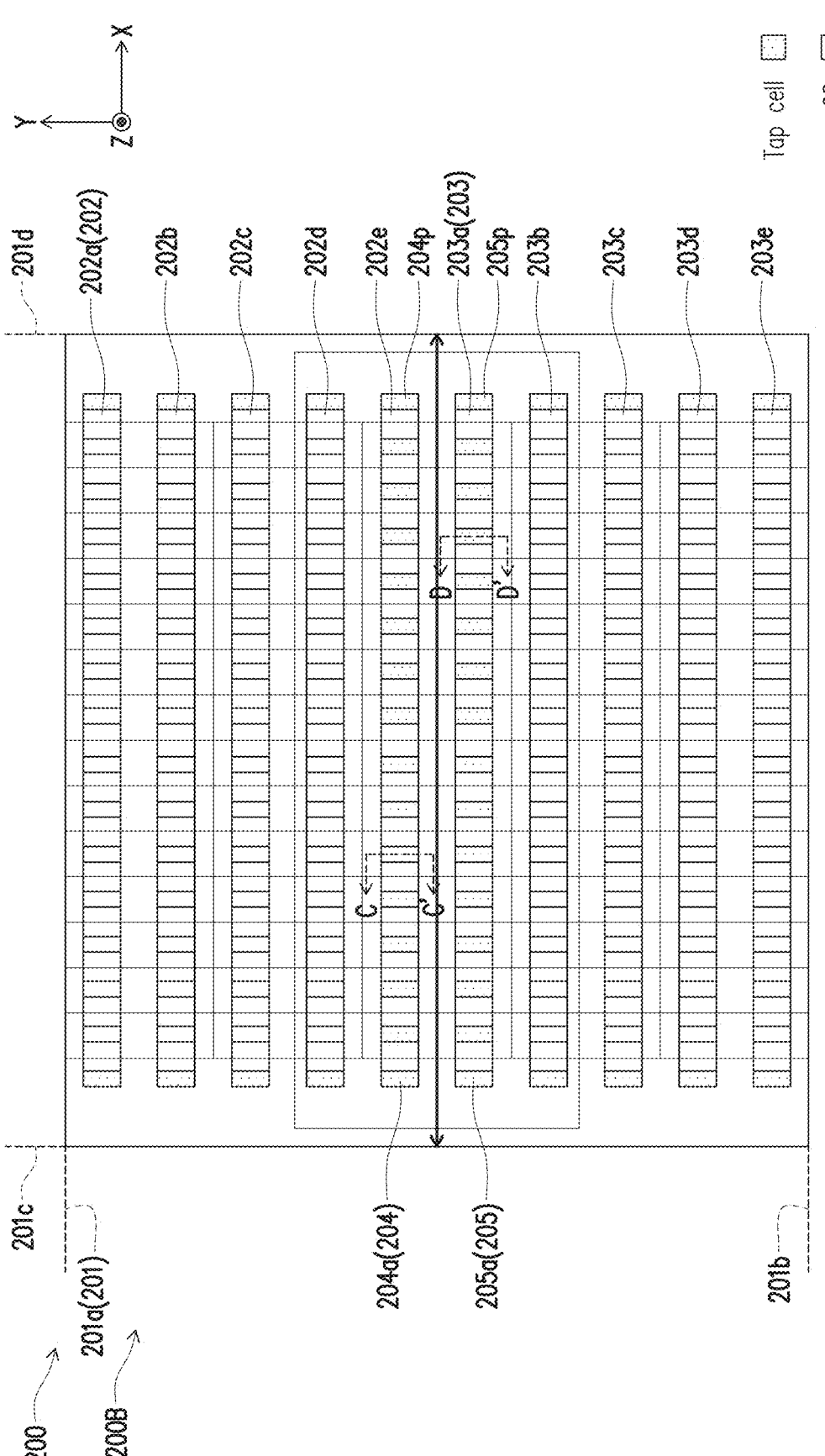

FIG. 2B is a top view of a portion 200B of the integrated circuit 200, simplified for ease of illustration.

Figures 2C, 2D:
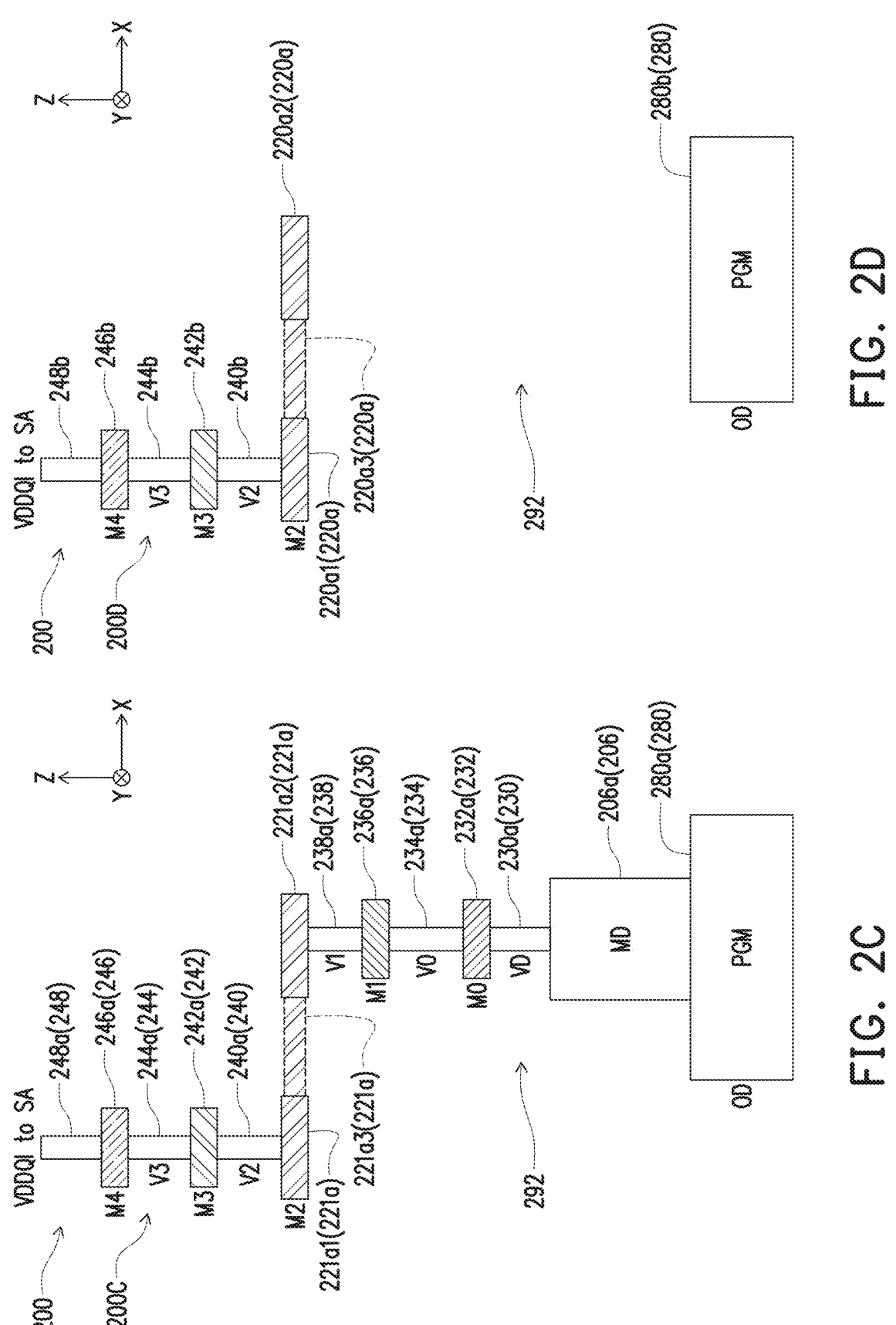
Figures 2E, 2F:
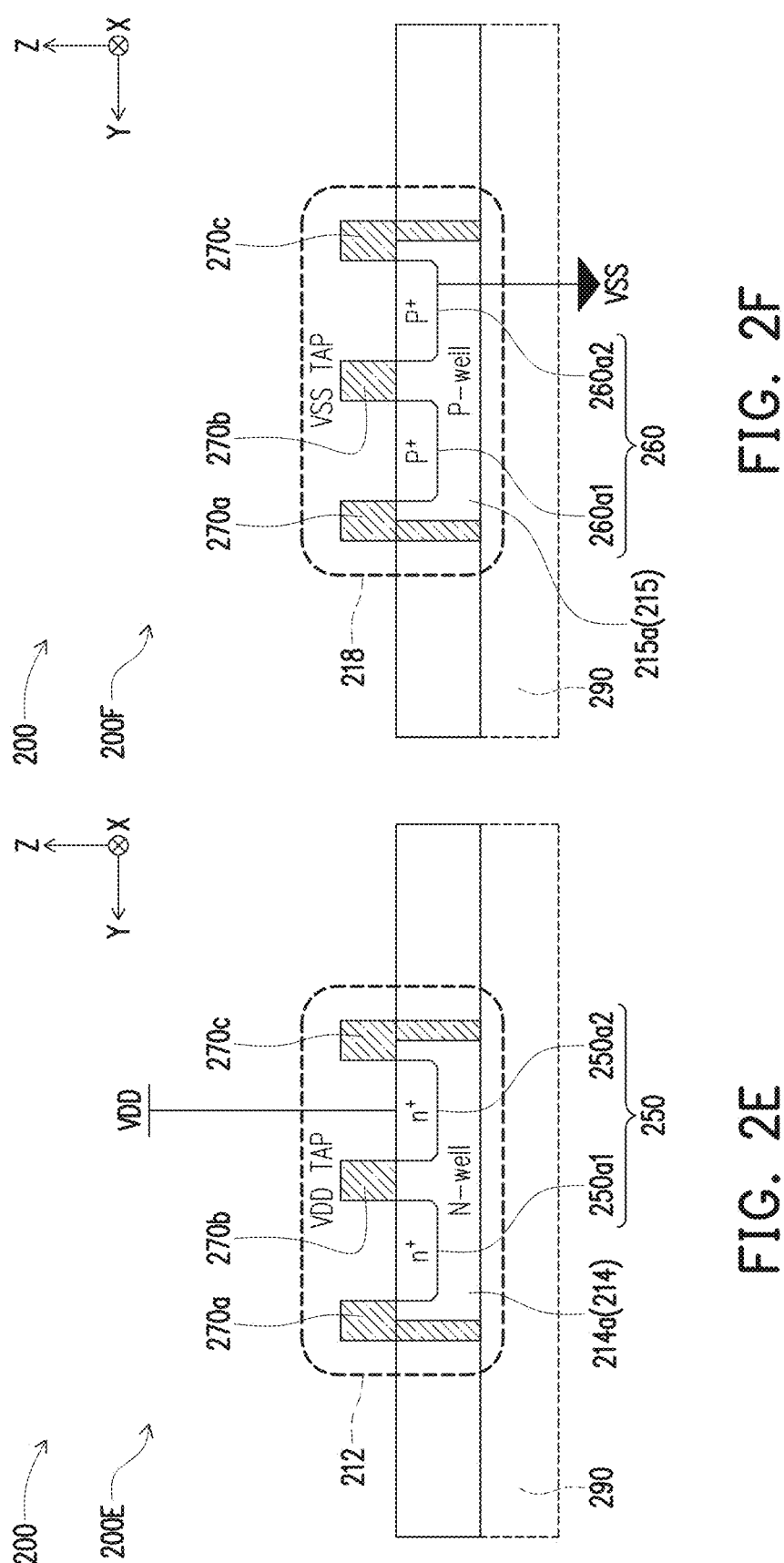

FIGS. 2C-2E are corresponding cross-sectional views of integrated circuit 200, in accordance with some embodiments.

FIG. 2C is a cross-sectional view of portion 200A of integrated circuit 200 as intersected by plane A-A', in accordance with some embodiments. FIG. 2D is a cross-sectional view of portion 200B of integrated circuit 200 as intersected by plane B-B', in accordance with some embodiments.

FIG. 2E is a cross-sectional view of portion 200B of integrated circuit 200 as intersected by plane C-C', in accordance with some embodiments. FIG. 2F is a cross-sectional view of portion 200B of integrated circuit 200 as intersected by plane D-D', in accordance with some embodiments.

For ease of illustration, some of the labeled elements of one or more of FIGS. 2A-2F, 3A-3C, 4-5, 6A-6B and 7 are not labelled in one or more of FIGS. 2A-2F, 3A-3C, 4-5, 6A-6B and 7. In some embodiments, integrated circuit 200 includes additional elements not shown in FIGS. 2A-2F.

Components that are the same or similar to those in one or more of FIGS. 2A-2F, 3A-3C, 4-5, 6A-6B and 7 (shown below) are given the same reference numbers, and detailed description thereof is thus omitted.

Portion 200A includes one or more features of a metal 2 (M2) level of integrated circuit 200.

Portion 200B includes one or more features of an oxide diffusion (OD) level or an active level of integrated circuit 200.

At least portion 200C or portion 200D includes one or more features of the OD level, a gate (POLY) level, a metal over diffusion (MD) level, a via over gate (VG) level, a via over diffusion (VD) level, a metal 0 (M0) level, a metal 1 (M1) level, the M2 level, a metal 3 (M3) level, a metal 4 (M4) level, a via 0 (V0) level, a via 1 (V1) level, a via 2 (V2) level, a via 3 (V3) level, and a via 4 (V4) level of integrated circuit 200.

At least portion 200E or portion 200F includes one or more features of the OD level and the POLY level of integrated circuit 200.

Integrated circuit 200 is manufactured by a corresponding layout design similar to integrated circuit 200. For brevity FIGS. 2A-2F, 3A-3C, 4-5, 6A-6B and 7 are described as a corresponding integrated circuit 200, 300A-300C, 400-500, 600A-600B and 700, but in some embodiments, FIGS. 2A-2F, 3A-3C, 4-5, 6A-6B and 7 also correspond to layout designs, and the structural elements of integrated circuit 200, 300A-300C, 400-500, 600A-600B and 700 also correspond to layout patterns of layout designs, and structural relationships including alignment, lengths and widths, as well as configurations and layers of integrated circuit 200, 300A-300C, 400-500, 600A-600B and 700 are similar to the structural relationships including alignment, lengths and widths, as well as configurations and layers of a corresponding layout design similar to integrated circuit 200, 300A-300C, 400-500, 600A-600B and 700, and similar detailed description will not be described for brevity.

Integrated circuit 200 includes a cell 201. The cell 201 has cell boundaries 201a and 201b that extend in a first direction X, and cell boundaries 201c and 201d that extend in a second direction Y. In some embodiments, the second direction Y is different from the first direction X. In some embodiments, integrated circuit 200 abuts other cells (shown in FIGS. 3A-3C, 4-5, 6A-6B and 7) along cell boundaries 201a, 201b, 201c and 201d. In some embodiments, integrated circuit 200 is a single height standard cell. Other types of cell heights are within the scope of the present disclosure.

In some embodiments, cell 201 is a standard cell, and integrated circuit 200 corresponds to a standard cell defined by cell boundaries 201a, 201b, 201c and 201d. In some embodiments, a cell 201 is a predefined portion of integrated circuit 200 including one or more transistors and electrical connections configured to perform one or more circuit functions. In some embodiments, cell 201 is bounded by cell boundaries 201a, 201b, 201c and 201d, and thus corresponds to a region of a memory cell that is part of a standard cell. In some embodiments, cell 201 is bounded by cell boundaries 201a, 201b, 201c and 201d, and thus corresponds to a region of functional circuit components or devices that are part of a standard cell.

In some embodiments, e.g., the embodiments depicted in FIGS. 2A-2F, 3A-3C, 4-5, 6A-6B and 7 (discussed below), a given cell has cell boundaries 201a, 201b, 201c and 201d that are overlapped by one or more corresponding gates of a set of gates 270. For example, in some embodiments, cell boundaries 201c and 201d of cell 201 are identified by gates 270a and 270c.

A cell is thereby configured as one or more of a standard cell of a memory cell. In some embodiments, a cell is thereby configured as one or more of a custom cell, an engineering change order (ECO) cell, a custom cell, a physical device cell, or another type of cell or combination of cells capable of being defined in an IC layout diagram, e.g., IC integrated circuit 200.

Integrated circuit 200 includes a set of active regions 202 and 203 in a substrate 290.

The set of active regions 202 or 203 extend in the first direction X. In some embodiments, the set of active regions 202 or 203 are manufactured by a corresponding set of active region patterns.

In some embodiments, the set of active regions 202 or 203 is located on a first layout level. In some embodiments, the first layout level corresponds to an active level or an OD level of one or more of integrated circuit 200, 300A-300C, 400, 500, 600A-600B or 700.

The set of active regions 202 includes one or more of active regions 202a, 202b, 202c, 202d or 202e embedded in the substrate 290 (FIGS. 2E-2F).

The set of active regions 203 includes one or more of active regions 203a, 203b, 203c, 203d or 203e embedded in the substrate 290.

Substrate has a front-side (not labelled) and a back-side (not labelled) opposite from the front-side. In some embodiments, at least the set of active regions 202 or 203, a set of gates 270 or a set of contacts 206 are formed in the front-side of substrate 290.

In some embodiments, one or more active regions in at least the set of active regions 202 or 203 correspond to source and drain regions of NMOS transistors of integrated circuit 200, 300A-300C, 400, 500, 600A-600B or 700.

In some embodiments, one or more active regions in at least the set of active regions 202 or 203 correspond to source and drain regions of PMOS transistors of integrated circuit 200, 300A-300C, 400, 500, 600A-600B or 700.

In some embodiments, at least active region 202e is an N-type doped S/D region embedded in a dielectric material of substrate 290, and active region 203a is a P-type doped S/D region embedded in the dielectric material of substrate 290.

In some embodiments, at least the set of active regions 202 or 203 corresponds to nanosheet structures (not labelled) of nanosheet transistors. In some embodiments, the set of active regions 202 include drain regions and source regions grown by an epitaxial growth process. In some embodiments, at least the set of active regions 202 or 203 include drain regions and source regions that are grown with an epitaxial material at the corresponding drain regions and source regions.

Other transistor types are within the scope of the present disclosure. For example, in some embodiments, at least the set of active regions 202 or 203 corresponds to nanowire structures (not shown) of nanowire transistors. In some embodiments, at least the set of active regions 202 or 203 corresponds to planar structures (not shown) of planar transistors. In some embodiments, at least the set of active regions 202 or 203 corresponds to fin structures (not shown) of finFETs. In some embodiments, at least the set of active regions 202 or 203 corresponds to structures (not shown) of complementary FETs (CFETs).

Other configurations, arrangements on other layout levels or quantities of structures in the set of active regions 202 or 203 are within the scope of the present disclosure.

Integrated circuit 200 further includes a set of tap cells 204 and 205.

The set of tap cells 204 includes at least one of tap cells 204*a*, . . . , 204*p*.

The set of tap cells 205 includes at least one of tap cells 205*a*, . . . , 205*p*.

Tap cell 204*a* includes a region 212 (FIG. 2E) that corresponds to active region 202*e* of FIG. 1B.

Region 212 includes a first well (also referred to herein as first well region) 214. The first well 214 includes implant regions 250*a*1 and 250*a*2. Region 212 is a tap cell of integrated circuit 200 and is coupled to the first voltage supply VDD. In other words, region 212 is configured to provide the first voltage supply VDD as the bias voltage (e.g., VDD) to a first portion 214*a* of the first well 214 by coupling the first voltage supply VDD to the implant region 250*a*1, 250*a*2. In some embodiments, region 212 is coupled to the second voltage supply VSS and is configured to provide the second voltage supply VSS as the bias voltage (e.g., VSS) to the first portion 214*a* of a first well 214. In some embodiments, the first portion 214*a* of the first well 214 is positioned within region 212. In some embodiments, the first portion 214*a* of the first well 214 extends in the second direction Y from gate 270*a* to gate 270*c*.

In some embodiments, a tap cell prevents latchup in integrated circuit 200. In some embodiments, latchup is a type of short circuit that sometimes occurs in integrated circuits.

Tap cell 205*a* includes a region 218 (FIG. 2F) that corresponds to active region 203*a* of FIG. 1B.

Region 218 includes a second well (also referred to herein as second well region) 215. The second well 215 includes implant regions 260*a*1 and 260*a*2. Region 218 is a tap cell of integrated circuit 200 and is coupled to the second voltage supply VSS. In other words, region 218 is configured to provide the second voltage supply VSS as the bias voltage (e.g., VSS) to the first portion 215*a* of a second well 215. In some embodiments, region 218 is coupled to the first voltage supply VDD, and is configured to provide the first voltage supply VDD as the bias voltage (e.g., VDD) to the first portion 215*a* of the second well 215 by coupling the first voltage supply VDD to the implant region 260*a*1, 260*a*2. In some embodiments, the first portion 215*a* of the second well 215 is positioned within region 218. In some embodiments, the first portion 215*a* of the second well 215 extends in the second direction Y from gate 270*a* to gate 270*c*.

Other configurations, arrangements on other layout levels or other numbers of tap cells in the set of tap cells 204 or 205 are within the scope of the present disclosure.

Integrated circuit 200 further includes an insulating region 292 (FIGS. 2C-2D) configured to electrically isolate one or more elements of the set of active regions 202 or 203, the set of gates 270, the set of contacts 206, a set of vias 230, 234, 238, 240, 244 or 248 and a set of conductors 220, 224, 232, 236, 242 or 246 from one another. In some embodiments, insulating region 292 includes multiple insulating regions deposited at different times from each other during method 800 (FIG. 8). In some embodiments, insulating region is a dielectric material. In some embodiments, the dielectric material includes silicon dioxide, silicon oxy-nitride, or the like.

Other configurations, arrangements on other layout levels or other numbers of portions in insulating region 292 are within the scope of the present disclosure.

Integrated circuit 200 further includes a set of gates 270.

The set of gates 270 includes one or more of gates 270*a*, 270*b* or 270*c*.

The set of gates 270 extend in the second direction Y. The set of gates 270 is above the set of active regions 202 and 203. In some embodiments, the set of gates 270 are manufactured by a corresponding set of gate patterns.

The set of gates 270 is positioned on a second layout level different from the first layout level. In some embodiments, the second layout level is different from the first layout level. In some embodiments, the second layout level corresponds to the POLY level of one or more of integrated circuit 200, 300A-300C, 400, 500, 600A-600B or 700. In some embodiments, the POLY level is above the OD level.

Other configurations, arrangements on other layout levels or quantities of patterns in the set of gates 270 are within the scope of the present disclosure.

In some embodiments, one or more gates of the set of gates 270 is divided into two or more discontinuous gate portions, and includes a removed gate portion. In some embodiments, the removed gate portion is removed during method 900 of FIG. 9 (described below).

In some embodiments, at least gate 270*a*, . . . , 270*c* corresponds to a dummy gate. In some embodiments, a dummy gate is a gate of a non-functional transistor.

Other configurations, arrangements on other layout levels or quantities of gates in the set of gates 270 are within the scope of the present disclosure.

Integrated circuit 200 further includes a set of contacts 206 (FIG. 2C).

The set of contacts 206 includes one or more of contact 206*a*.

The set of contacts 206 are located on the front-side of integrated circuit 200. The set of contacts 206 overlap the set of active regions 202 and 203. In some embodiments, the set of contacts 206 are manufactured by a corresponding set of contact patterns.

Each contact of the set of contacts 206 corresponds to one or more drain or source terminals of PMOS or NMOS transistors of integrated circuit 200.

In some embodiments, one or more contacts of the set of contacts 206 overlaps a pair of active regions of the set of active regions 202 or 203, thereby electrically coupling the pair of active regions of the set of active regions 202 or 203, and the source or drain of the corresponding transistors.

The set of contact 206 is located on a third layout level. In some embodiments, the third layout level is different from the first layout level. In some embodiments, the third layout level corresponds to the contact level or an MD level of one or more of integrated circuit 200, 300A-300C, 400, 500, 600A-600B or 700. In some embodiments, the MD level is above the OD level.

Other lengths or widths for the set of contacts 206 are within the scope of the present disclosure. Other configurations, arrangements on other layout levels or quantities of conductors in the set of contacts 206 are within the scope of the present disclosure.

Integrated circuit 200 further includes a set of vias 230. The set of vias 230 includes one or more of vias 230a.

In some embodiments, the set of vias 230 are between the set of contacts 206 and a set of conductors 232. The set of vias 230 is embedded in insulating region 292. In some embodiments, the set of vias are between the set of gates 270 and the set of conductors 232. In some embodiments, the set of vias 230 are manufactured by a corresponding set of via patterns.

The set of vias 230 is located where the set of contacts 206 are overlapped by the set of conductors 232. Via 230a is located where contact 206a is overlapped by corresponding conductor 232a.

The set of vias 230 are configured to electrically couple the set of active regions 202 or 203 and the set of conductors 232 together by the set of contacts 206. In some embodiments, the set of vias 230 are configured to electrically couple a corresponding source or drain region of the set of active regions 202 or 203 to the set of conductors 232.

In some embodiments, vias in the set of vias 230 are positioned below M0 routing tracks.

Other configurations, arrangements on other layout levels or quantities of vias in the set of vias 230 are within the scope of the present disclosure.

Integrated circuit 200 further includes a set of conductors 232.

The set of conductors 232 includes one or more of conductor 232a. In some embodiments, the set of conductors 232 corresponds to a set of conductive structures. The set of conductors 232 is embedded in insulating region 292. In some embodiments, the set of conductors 232 are manufactured by a corresponding set of conductive feature patterns.

The set of conductors 232 extend in the first direction X. The set of conductors 232 overlap the set of contacts 206 and the set of gates 270. Conductor 232a overlaps a program device 280a that is positioned within at least one of active region 202a, 202b, 202c, 202d or 202e of the set of active regions 202. In some embodiments, program device 280a corresponds to NMOS transistor N0 of FIG. 1A. In some embodiments, program device 280a corresponds to PMOS transistor P0 of FIG. 1B.

In some embodiments, the set of conductors 232 is configured to provide the routing of signals, and are referred to as "signal lines." For example, conductor 232a is configured to route signals to/from other portions of integrated circuit 200 or other devices (not shown for ease of illustration).

In some embodiments, the set of conductors 232 are located on a fourth layout level. In some embodiments, the fourth layout level is different from the first layout level, the second layout level and the third layout level. In some embodiments, the fourth layout level corresponds to the M0 level of one or more of integrated circuit 200, 300A-300C, 400, 500, 600A-600B or 700. In some embodiments, the M0 level is above the OD level, the MD level, the POLY level and the VD/VG level.

In some embodiments, the set of conductors 232 corresponds to 3 to 5 M0 routing tracks in integrated circuit 200. Other numbers of M0 routing tracks are within the scope of the present disclosure.

In some embodiments, integrated circuit 200 further includes power rails similar to the set of conductors 232, and is not shown in FIGS. 2A-2E for ease of illustration, and similar detailed description is omitted for brevity.

Other configurations, arrangements on other layout levels or quantities of conductors in the set of conductors 232 are within the scope of the present disclosure.

Integrated circuit 200 further includes a set of vias 234. The set of vias 234 includes one or more of vias 234a.

In some embodiments, the set of vias 234 are between the set of conductors 232 and a set of conductors 236. The set of vias 234 is embedded in insulating region 292. In some embodiments, the set of vias 234 are manufactured by a corresponding set of via patterns.

The set of vias 234 is located where the set of conductors 232 are overlapped by the set of conductors 236. Via 234a is located where conductor 232a is overlapped by corresponding conductor 236a.

The set of vias 234 are configured to electrically couple the set of conductors 232 and the set of conductors 236 together.

The set of vias 234 is located on the V0 level of one or more of integrated circuit 200, 300A-300C, 400, 500, 600A-600B or 700. In some embodiments, vias in the set of vias 234 are positioned below M1 routing tracks.

Other configurations, arrangements on other layout levels or quantities of vias in the set of vias 234 are within the scope of the present disclosure.

Integrated circuit 200 further includes a set of conductors 236.

The set of conductors 236 includes one or more of conductor 236a. In some embodiments, the set of conductors 236 corresponds to a set of conductive structures. The set of conductors 236 is embedded in insulating region 292. In some embodiments, the set of conductors 236 are manufactured by a corresponding set of conductive feature patterns.

The set of conductors 236 extend in the second direction Y. The set of conductors 236 overlap the set of conductors 232, the set of contacts 206 and the set of gates 270.

In some embodiments, the set of conductors 236 are located on a fifth layout level. In some embodiments, the fifth layout level is different from the first layout level, the second layout level, the third layout level and the fourth layout level. In some embodiments, the fifth layout level corresponds to the M1 level of one or more of integrated circuit 200, 300A-300C, 400, 500, 600A-600B or 700. In some embodiments, the M1 level is above the OD level, the MD level, the POLY level, the VD/VG level and the M0 level.

In some embodiments, the set of conductors 236 corresponds to a number of M1 routing tracks in integrated circuit 200. Any number of M1 routing tracks are within the scope of the present disclosure.

Other configurations, arrangements on other layout levels or quantities of conductors in the set of conductors 236 are within the scope of the present disclosure.

Integrated circuit 200 further includes a set of vias 238. The set of vias 238 includes one or more of vias 238a.

In some embodiments, the set of vias 238 are between the set of conductors 236 and one or more of a set of conductors 221 or 224. The set of vias 238 is embedded in insulating region 292. In some embodiments, the set of vias 238 are manufactured by a corresponding set of via patterns.

The set of vias 238 is located where the set of conductors 236 are overlapped by one or more of a set of conductors 221 or 224. Via 238a is located where conductor 236a is overlapped by corresponding conductor 221a.

The set of vias 238 are configured to electrically couple the set of conductors 236 and one or more of a set of conductors 221 or 224 together. In some embodiments, the set of vias 238 do not electrically couple the set of conductors 220 to one or more underlying layers (e.g., OD, MD, POLY, M0, M1 or the like).

The set of vias 238 is located on the V1 level of one or more of integrated circuit 200, 300A-300C, 400, 500, 600A-600B or 700. In some embodiments, vias in the set of vias 238 are positioned below M2 routing tracks.

Other configurations, arrangements on other layout levels or quantities of vias in the set of vias 238 are within the scope of the present disclosure.

Integrated circuit 200 further includes a set of conductors 220.

The set of conductors 220 includes one or more of conductors 220a or 220b. In some embodiments, the set of conductors 220 corresponds to a set of conductive structures. The set of conductors 220 is embedded in insulating region 292. In some embodiments, the set of conductors 220 are manufactured by a corresponding set of conductive feature patterns.

The set of conductors 220 extend in the first direction X. The set of conductors 220 overlap the set of conductors 236 and 232, the set of active region 202 or 203, the set of contacts 206 and the set of gates 270.

In some embodiments, at least one of the set of conductors 220, 221 or 224 are located on a sixth layout level. In some embodiments, the sixth layout level is different from the first layout level, the second layout level, the third layout level, the fourth layout level, and the fifth layout level.

In some embodiments, the sixth layout level corresponds to the M2 level of one or more of integrated circuit 200, 300A-300C, 400, 500, 600A-600B or 700. In some embodiments, the M2 level is above the OD level, the MD level, the POLY level, the VD/VG/V0/V1/V2 level, the M0 level, and the M1 level.

In some embodiments, conductor 220a includes conductors 220a1, 220a2 and 220a3. Each of conductor 220a1, 220a2 and 220a3 are aligned with each other in the first direction X.

In some embodiments, each of conductors 220a1, 220a2 and 220a3 corresponds to a single continuous conductive structure, and conductor 220a is configured as a dummy fuse that is associated with a "low resistance state". In some embodiments, a dummy fuse is a fuse element that is not electrically coupled to one or more underlying transistor devices. For example, as shown in FIG. 2D, conductor 220a overlaps programming device 280b, but conductor 220a is not electrically coupled to programming device 280b. As shown in FIG. 2D, portion 200D does not include vias in the VD level, the V0 level, and the V1 level that are directly above the programming device 280b or directly below conductor 220a. As shown in in FIG. 2D, portion 200D does not include conductors in the MD level, the M0 level, and the M1 level that are directly above the programming device 280b or directly below conductor 220a. In some embodiments, a dummy fuse is a fuse element that is not electrically coupled to one or more active regions of one or more underlying transistor devices. In some embodiments, conductor 220a is not electrically coupled to an active region of programming device 280b. In some embodiments, since conductor 220a is not electrically coupled to programming device 280b, conductor 220a is also configured to be electrically floating.

In some embodiments, conductor 220a does not include conductor 220a3, and conductors 220a1 and 220a2 are separated from each other in the first direction X, and are not part of an integral or single continuous conductive structure, and conductor 220a is configured as a dummy fuse that is associated with a "high resistance state." In some embodiments, conductors 220a1 and 220a2 are not electrically coupled to each other in the "high resistance state."

In some embodiments, a "low resistance state" corresponds to a logic 1, and a "high resistance state" corresponds to a logic 0. In some embodiments, a "low resistance state" corresponds to a logic 1, and a "high resistance state" corresponds to a logic 1.

In some embodiments, conductor 220b includes conductors 220b1, 220b2 and 220b3. Each of conductor 220b1, 220b2 and 220b3 are aligned with each other in the first direction X.

In some embodiments, each of conductors 220b1, 220b2 and 220b3 corresponds to a single continuous conductive structure, and conductor 220b is configured as a dummy fuse that is associated with a "low resistance state." In some embodiments, conductor 220b overlaps a programming device (not shown, but similar to programming device 280b), but conductor 220b is not electrically coupled to the programming device. In some embodiments, conductor 220b is not electrically coupled to a programming device, and conductor 220b is also configured to be electrically floating.

In some embodiments, conductor 220b does not include conductor 220b3, and conductors 220b1 and 220b2 are separated from each other in the first direction X, and are not part of an integral or single continuous conductive structure, and conductor 220b is configured as a dummy fuse that is associated with a "high resistance state." In some embodiments, conductors 220b1 and 220b2 are not electrically coupled to each other in the "high resistance state."

In some embodiments, conductor 220a or 220b corresponds to a dummy fuse of a dummy memory cell, and similar detailed description is omitted for brevity. In some embodiments, conductor 220a or 220b corresponds to eFuse Rfuse in FIGS. 1A-1B, and similar detailed description is omitted for brevity.

In some embodiments, the set of conductors 220 corresponds to M2 tracks in integrated circuit 200. Other numbers of M2 tracks are within the scope of the present disclosure.

Other numbers of dummy fuses in the set of conductors 220 are within the scope of the present disclosure. Other numbers of conductors in the set of conductors 220 are within the scope of the present disclosure.

Other configurations, arrangements on other layout levels or quantities of conductors in the set of conductors 220 are within the scope of the present disclosure.

Integrated circuit 200 further includes a set of conductors 221.

The set of conductors 221 includes one or more of conductors 221a. In some embodiments, the set of conductors 221 corresponds to a set of conductive structures. The set of conductors 221 is embedded in insulating region 292. In some embodiments, the set of conductors 221 are manufactured by a corresponding set of conductive feature patterns.

The set of conductors 221 extend in the first direction X. The set of conductors 221 overlap the set of conductors 236 and 232, the set of active region 202 or 203, the set of contacts 206 and the set of gates 270.

In some embodiments, each conductor 221a of the set of conductors 221 corresponds to a fuse of a memory cell, and similar detailed description is omitted for brevity. In some embodiments, conductor 221a corresponds to eFuse Rfuse in FIGS. 1A-1B, and similar detailed description is omitted for brevity.

In some embodiments, conductor 221a includes conductors 221a1, 221a2 and 221a3. Each of conductor 221a1, 221a2 and 221a3 are aligned with each other in the first direction X.

In some embodiments, each of conductors 221a1, 221a2 and 221a3 corresponds to a single continuous conductive structure, and conductor 221a is configured as a fuse that is associated with a "low resistance state".

As shown in FIG. 2D, conductor 221a overlaps programming device 280a, and conductor 221a is electrically coupled to programming device 280a. For example, an active region of programming device 280a is electrically coupled to contact 206a, and contact 206a is electrically coupled to conductor 232a by via 230a, and conductor 232a is electrically coupled to conductor 236a by via 234a, and conductor 236a is electrically coupled to conductor 221a by via 238a. Stated differently, conductor 221a is not electrically floating.

In some embodiments, conductor 221a does not include conductor 221a3, and conductors 221a1 and 221a2 are separated from each other in the first direction X, and are not part of an integral or single continuous conductive structure, and conductor 221a is configured as a fuse that is associated with a "high resistance state." In some embodiments, conductors 221a1 and 221a2 are not electrically coupled to each other in the "high resistance state."

In some embodiments, the set of conductors 221 corresponds to M2 tracks in integrated circuit 200. Other numbers of M2 tracks are within the scope of the present disclosure.

Other numbers of fuses in the set of conductors 221 are within the scope of the present disclosure. Other numbers of conductors in the set of conductors 221 are within the scope of the present disclosure.

Other configurations, arrangements on other layout levels or quantities of conductors in the set of conductors 221 are within the scope of the present disclosure.

Integrated circuit 200 further includes a set of conductors 224.

The set of conductors 224 includes one or more of conductors 224a, 224b, 224c, . . . , 224m or 224n. In some embodiments, the set of conductors 224 corresponds to a set of conductive structures. The set of conductors 224 is embedded in insulating region 292. In some embodiments, the set of conductors 224 are manufactured by a corresponding set of conductive feature patterns.

The set of conductors 224 extend in the first direction X. The set of conductors 224 overlap the set of conductors 236 and 232, the set of active region 202 or 203, the set of contacts 206 and the set of gates 270.

Conductor 224a includes conductor 224a1 and 224a2. Each of conductor 224a1 and 224a2 are separated from each other in the first direction X.

Conductor 224g includes conductor 224g1 and 224g2. Each of conductor 224g1 and 224g2 are separated from each other in the first direction X.

Conductor 224h includes conductor 224h1 and 224h2. Each of conductor 224h1 and 224h2 are separated from each other in the first direction X.

Conductor 224n includes conductor 224n1 and 224n2. Each of conductor 224n1 and 224n2 are separated from each other in the first direction X.

In some embodiments, one or more conductors in the set of conductors 224 is divided into separate portions similar to conductor 224a, and similar detailed description is omitted for brevity.

In some embodiments, one or more of conductors 224a1 and 224a, conductors 224g1 and 224g2, conductors 224h1 and 224h2 or conductors 224n1 and 224n2 are joined into a single portion similar to conductor 224b, and similar detailed description is omitted for brevity.

In some embodiments, conductor 224d corresponds to word line WL0 in FIGS. 1A-1B, and similar detailed description is omitted for brevity.

In some embodiments, conductor 224k corresponds to word line WL0 in FIGS. 1A-1B, and similar detailed description is omitted for brevity.

In some embodiments, conductor 224d corresponds to a word line, and conductor 224k corresponds to a dummy word line. In some embodiments, a dummy word line is a word line that is not electrically coupled to functional transistors. In some embodiments, conductor 224k corresponds to a word line, and conductor 224d corresponds to a dummy word line.

In some embodiments, at least one or more conductors in the set of conductors 224 is coupled to a node of a bit cell, such as circuit 100A or 100B. In some embodiments, at least one or more conductors in the set of conductors 224 is coupled to a voltage supply node of a bit cell, such as circuit 100A or 100B. In some embodiments, at least one or more conductors in the set of conductors 224 is coupled to a reference voltage supply node of a bit cell, such as circuit 100A or 100B. In some embodiments, at least one or more conductors in the set of conductors 224 a dummy metal track that is not electrically coupled to other elements or conductors.

In some embodiments, the set of conductors 224 corresponds to M2 tracks in integrated circuit 200-200B. Other numbers of M2 tracks are within the scope of the present disclosure.

In some embodiments, the set of conductors 224 is configured to provide the routing of signals, and are referred to as "signal lines." For example, conductor 224d or 224k is configured to route word line signals on corresponding word lines to/from other portions of integrated circuit 200 or other devices (not shown for ease of illustration). Other numbers of word lines or dummy word lines are within the scope of the present disclosure.

Other configurations, arrangements on other layout levels or quantities of conductors in the set of conductors 224 are within the scope of the present disclosure.

Integrated circuit 200 further includes a set of vias 240. The set of vias 240 includes one or more of vias 240a or 240b.

In some embodiments, the set of vias 240 are between one or more of the set of conductors 220, 221 or 224 and a set of conductors 242. The set of vias 240 is embedded in insulating region 292. In some embodiments, the set of vias 240 are manufactured by a corresponding set of via patterns.

The set of vias 240 is located where one or more of the set of conductors 220, 221 or 224 are overlapped by the set of conductors 242. Via 240a is located where conductor 221a is overlapped by corresponding conductor 242a. Via 240b is located where conductor 220a is overlapped by corresponding conductor 242b.

The set of vias 240 are configured to electrically couple one or more of the set of conductors 220, 221 or 224 and the set of conductors 242 together.

The set of vias 240 is located on the V2 level of one or more of integrated circuit 200, 300A-300C, 400, 500, 600A-600B or 700. In some embodiments, vias in the set of vias 240 are positioned below M3 routing tracks.

Other configurations, arrangements on other layout levels or quantities of vias in the set of vias 240 are within the scope of the present disclosure.

Integrated circuit 200 further includes a set of conductors 242.

The set of conductors 242 includes one or more of conductor 242*a* or 242*b*. In some embodiments, the set of conductors 242 corresponds to a set of conductive structures. The set of conductors 242 is embedded in insulating region 292. In some embodiments, the set of conductors 242 are manufactured by a corresponding set of conductive feature patterns.

The set of conductors 242 extend in the second direction Y. The set of conductors 242 overlap the set of conductors 220, 221, 224, 236 or 232, the set of contacts 206 and the set of gates 270.

In some embodiments, the set of conductors 242 are located on a seventh layout level. In some embodiments, the seventh layout level is different from the first layout level, the second layout level, the third layout level, the fourth layout level, the fifth layout level and the sixth layout level.

In some embodiments, the seventh layout level corresponds to the M3 level of one or more of integrated circuit 200, 300A-300C, 400, 500, 600A-600B or 700. In some embodiments, the M3 level is above the OD level, the MD level, the POLY level, the VD/VG/V0/V1/V2 level, the M0 level, the M1 level and the M2 level.

In some embodiments, the set of conductors 242 corresponds to a number of M3 tracks in integrated circuit 200. Any number of M3 tracks are within the scope of the present disclosure.

Other configurations, arrangements on other layout levels or quantities of conductors in the set of conductors 242 are within the scope of the present disclosure.

Integrated circuit 200 further includes a set of vias 244.

The set of vias 244 includes one or more of vias 244*a* or 244*b*.

In some embodiments, the set of vias 244 are between set of conductors 242 and a set of conductors 246. The set of vias 244 is embedded in insulating region 292. In some embodiments, the set of vias 244 are manufactured by a corresponding set of via patterns.

The set of vias 244 is located where the set of conductors 242 are overlapped by the set of conductors 246. Via 244*a* is located where conductor 242*a* is overlapped by corresponding conductor 246*a*. Via 244*b* is located where conductor 242*b* is overlapped by corresponding conductor 246*b*.

The set of vias 244 are configured to electrically couple the set of conductors 242 and the set of conductors 246 together.

The set of vias 244 is located on the V3 level of one or more of integrated circuit 200, 300A-300C, 400, 500, 600A-600B or 700. In some embodiments, vias in the set of vias 244 are positioned below M4 tracks.

Other configurations, arrangements on other layout levels or quantities of vias in the set of vias 244 are within the scope of the present disclosure.

Integrated circuit 200 further includes a set of conductors 246.

The set of conductors 246 includes one or more of conductor 246*a* or 246*b*. In some embodiments, the set of conductors 246 corresponds to a set of conductive structures. The set of conductors 246 is embedded in insulating region 292. In some embodiments, the set of conductors 246 are manufactured by a corresponding set of conductive feature patterns.

The set of conductors 246 extend in the first direction X. The set of conductors 246 overlap the set of conductors 242, 220, 221, 224, 236 or 232, the set of contacts 206 and the set of gates 270.

In some embodiments, the set of conductors 246 are located on an eighth layout level. In some embodiments, the eighth layout level is different from the first layout level, the second layout level, the third layout level, the fourth layout level, the fifth layout level, the sixth layout level and the seventh layout level. In some embodiments, the eighth layout level corresponds to the M4 level of one or more of integrated circuit 200, 300A-300C, 400, 500, 600A-600B or 700. In some embodiments, the M4 level is above the OD level, the MD level, the POLY level, the VD/VG/V0/V1/V2/V3 level, the M0 level, the M1 level, the M2 level and the M3 level.

In some embodiments, the set of conductors 246 corresponds to a number of M4 tracks in integrated circuit 200. Any number of M4 tracks are within the scope of the present disclosure.

Other configurations, arrangements on other layout levels or quantities of conductors in the set of conductors 246 are within the scope of the present disclosure.

Integrated circuit 200 further includes a set of vias 248.

The set of vias 248 includes one or more of vias 248*a* or 248*b*.

In some embodiments, the set of vias 248 are between the set of conductors 246 and a set of conductors (not shown). The set of vias 248 is embedded in insulating region 292. In some embodiments, the set of vias 248 are manufactured by a corresponding set of via patterns.

The set of vias 248 is located where the set of conductors 246 are overlapped by the set of conductors (not shown). Via 248*a* is located where conductor 246*a* is overlapped by a first conductor (not shown). Via 248*b* is located where conductor 246*b* is overlapped by a second conductor (not shown).

The set of vias 248 are configured to electrically couple the set of conductors 246 and the set of conductors (not shown) together. In some embodiments, the set of vias are coupled to a voltage supply VDDQI or a sense amplifier (not shown).

The set of vias 248 is located on the V4 level of one or more of integrated circuit 200, 300A-300C, 400, 500, 600A-600B or 700. In some embodiments, vias in the set of vias 248 are positioned below M5 tracks or other upper layers.

Other configurations, arrangements on other layout levels or quantities of vias in the set of vias 248 are within the scope of the present disclosure.

In some embodiments, at least one gate region of the set of gates 270 are formed using a doped or non-doped polycrystalline silicon (or polysilicon). In some embodiments, at least one gate region of the set of gates 270 include a metal, such as Al, Cu, W, Ti, Ta, TiN, TaN, NiSi, CoSi, other suitable conductive materials, or combinations thereof.

In some embodiments, at least one contact of the set of contacts 206, at least one conductor of the set of conductors 220, 221, 224, 232, 236, 242 or 246, at least one via of the set of vias 230, 234, 238, 240, 244 or 248, at least one conductor of the set of conductors 322, 420, 421, 524, 620, 621, 720, 721, 722 or 723 or at least one via of the set of vias 338 includes one or more layers of a conductive material, a metal, a metal compound or a doped semiconductor. In some embodiments, the conductive material includes Tungsten, Cobalt, Ruthenium, Copper, or the like or combinations thereof. In some embodiments, a metal includes at least Cu (Copper), Co, W, Ru, Al, or the like. In some embodiments, a metal compound includes at least AlCu, W—TiN, TiSix, NiSix, TiN, TaN, or the like. In some embodiments, a doped semiconductor includes at least doped silicon, or the like.

In some embodiments, by including the set of conductors 220 in the integrated circuit 200, integrated circuit 200 includes an array of metal fuses that includes dummy (e.g., false) fuses and effective (e.g., true) fuses thereby increasing the difficulty of decrypting codes associated with each effective fuse/bit cell, and thereby resulting in enhanced security of the location of effective (e.g., true) fuses and corresponding codes associated with each fuse/bit cell compared to other approaches.

In some embodiments, by enhancing the security of the locations of one or more effective (e.g., true) fuses or dummy fuses, reverse engineering of integrated circuit 200 becomes more difficult and increases the amount of time and money utilized to identify which of the fuses is an effective fuse and which of the fuses is a dummy fuse in integrated circuit 200.

Other materials, configurations, arrangements on other layout levels or quantities of elements in integrated circuit 200 are within the scope of the present disclosure.

Figure 3A:
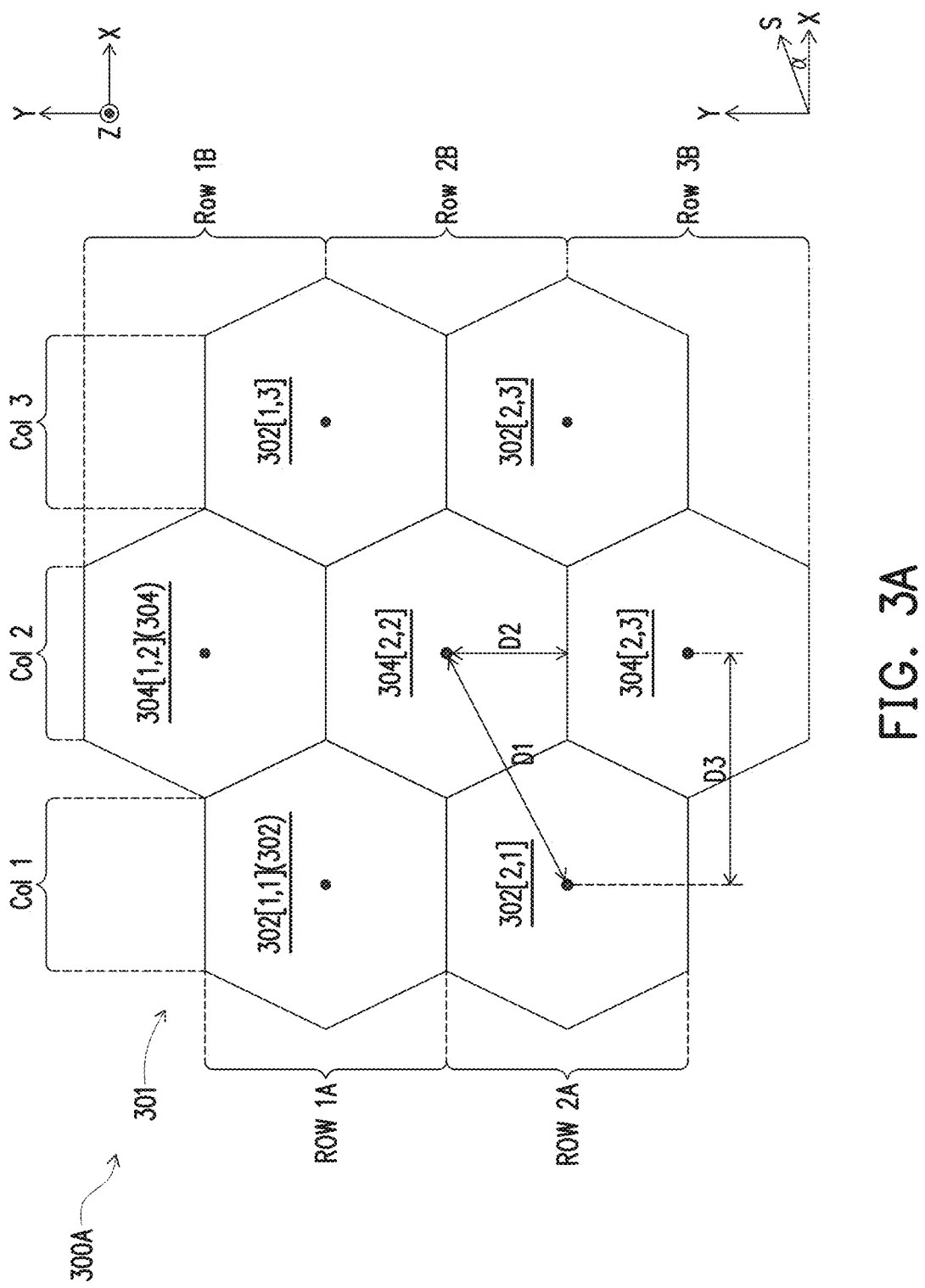
FIG. 3A is a diagram of a top view of an integrated circuit, in accordance with some embodiments.

FIG. 3A is a diagram of a top view of an integrated circuit 300A, in accordance with some embodiments.

Integrated circuit 300A comprises an array of tiles 301 having 2 or 3 rows and 3 columns. Other number of rows or columns are within the scope of the present disclosure.

In some embodiments, the array of tiles 301 has a honeycomb shape. Other shapes of the array of tiles 301 are within the scope of the present disclosure.

The rows of cells in array of tiles 201 are arranged in the first direction X. The columns of cells in array of tiles 201 are arranged in a second direction Y. In some embodiments, the second direction Y is perpendicular to the first direction X.

In some embodiments, circuit 100A of FIG. 1A or circuit 100A of FIG. 1A is usable as one or more tiles in array of tiles 301. In some embodiments, integrated circuit 200 FIGS. 2A-2F is usable as one or more tiles in array of tiles 301.

The array of tiles 301 comprises a first set of tiles 302 and a second set of tiles 304. In some embodiments, the use of the term "tile" is used interchangeably with "cell."

In some embodiments, at least one tile of the first set of tiles 302 corresponds to integrated circuit 100A, 100B or 200, and at least one tile of the second set of tiles 304 corresponds to layout design 100A, 100B or 200.

The first set of tiles 302 and the second set of tiles 304 are arranged in corresponding columns in an alternating manner. For example, the first set of tiles 302 and the second set of tiles 304 alternate with each other in the first direction X.

The first set of tiles 302 includes 2 rows (e.g., Row 1A and Row 2A). The second set of tiles 304 includes 3 rows (e.g., Row 1B, Row 2B and Row 3B).

The first set of tiles 302 and the second set of tiles 304 extend in the second direction Y.

The first set of tiles 302 comprises one or more of tiles 302[1,1], 302[2,1], 302[1,3], and 302[2,3]. Other number of tiles in the first set of tiles 302 are within the scope of the present disclosure.

The second set of tiles 304 comprises one or more of tiles 304[1,2], 304[2,2] and 304[2,3]. Other number of tiles in the second set of tiles 304 are within the scope of the present disclosure.

Each tile of the first set of tiles 302 or the second set of tiles 304 is adjacent to or directly next to another tile. The second set of tiles 304 is separated from the first set of tiles 302 in the first direction X.

A center of each tile of the first set of tiles 302 is offset from a center of an adjacent tile of the second set of tiles 304 in a third direction S by a distance D1. For example, the center of tile 302[2,1] is separated from the center of tile 304[2,2] in the third direction S by the distance D1.

The third direction S relates to the first direction X and the second direction Y. For example, in some embodiments, the third direction S is rotated from the first direction X towards the second direction Y by an angle $\alpha$. In some embodiments, the angle $\alpha$ ranges from about 0 degrees to about 180 degrees. The angle $\alpha$ is expressed by formula 2 (described below). In some embodiments, the third direction S is equal to the first direction X or the second direction Y. In some embodiments, the third direction S is different from the first direction X or the second direction Y.

A center of each tile of the first set of tiles 302 is separated from a center of an adjacent tile of the second set of tiles 304 in the second direction Y by a distance D2. For example, the center of tile 302[2,1] is separated from the center of tile 304[2,2] in the second direction Y by the distance D3.

A center of each tile of the first set of tiles 302 is separated from a center of an adjacent tile of the second set of tiles 304 in the first direction X by a distance D3. For example, the center of tile 302[2,1] is separated from the center of tile 304[2,3] in the first direction X by the distance D3.

A relationship between distances D1, D2 and D3 is expressed by formula 1.

$$D1 = \left(D2^2 + D3^2\right)^{0.5} \tag{1}$$

The second set of tiles 304 extends in the third direction S. A relationship between angle $\alpha$ and distances D2 and D3 is expressed by formula 2.

$$\alpha = \text{ArcCos}(D3/D1) \tag{2}$$

In some embodiments, at least one of distances D1, D2 or D3 is different from another of distances D1, D2 or D3. In some embodiments, at least one of distances D1, D2 or D3 is the same as another of distances D1, D2 or D3.

In some embodiments, a shape of the first set of tiles 302 and a shape of the second set of tiles 304 are polygonal, and therefore the shape of integrated circuit 300A can also be polygonal.

In some embodiments, a shape of the first set of tiles 302 and a shape of the second set of tiles 304 are hexagonal, and therefore the shape of integrated circuit 300A can also be hexagonal.

In some embodiments, a shape of the first set of tiles 302 and a shape of the second set of tiles 304 are rectangular, and therefore the shape of integrated circuit 300A can also be rectangular.

Other quantities or configurations of the first set of tiles 302 or the second set of tiles 304 are within the scope of the present disclosure.

Other shapes or configurations of the first set of tiles 302 or the second set of tiles 304 are within the scope of the present disclosure.

Other shapes or configurations of integrated circuit 300A are within the scope of the present disclosure.

Figure 3B:
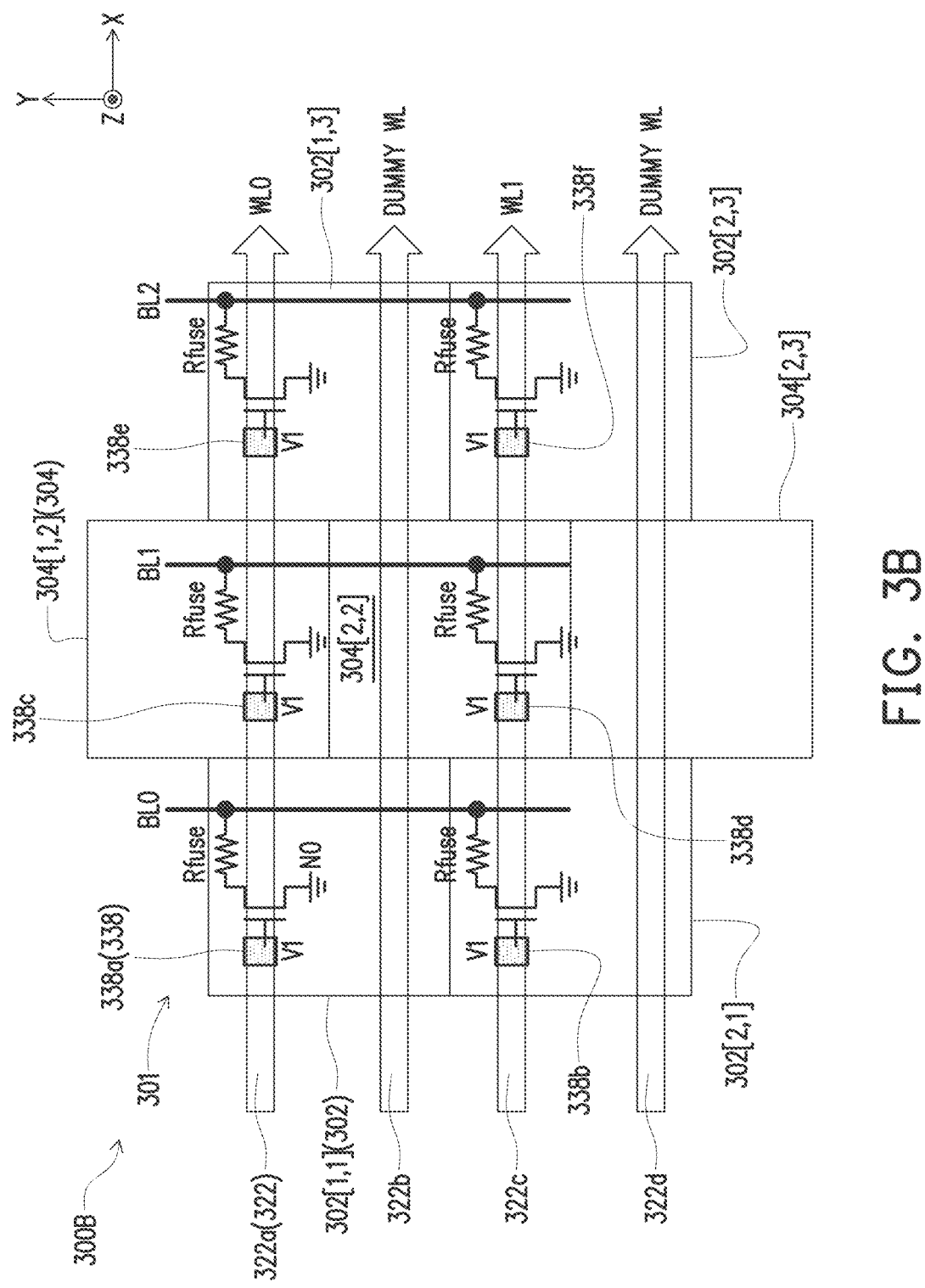
FIG. 3B is a diagram of a top view of an integrated circuit, in accordance with some embodiments.

FIG. 3B is a diagram of a top view of an integrated circuit 300B, in accordance with some embodiments.

Integrated circuit 300B is an embodiment of integrated circuit 300A, and similar detailed description is omitted for brevity.

Integrated circuit 300B comprises the array of tiles 301 and a set of conductors 322.

The set of conductors 322 is an embodiment of the set of conductors 224 of integrated circuit 200, and similar detailed description is omitted for brevity.

The set of conductors 322 includes one or more of conductors 322a, 322b, 322c or 322d.

In some embodiments, at least one of conductors 322a, 322b, 322c or 322d is at least one or more of conductors 224d or 224k of FIGS. 2A-2F, and similar detailed description is omitted for brevity.

In some embodiments, conductor 322a corresponds to word line WL0 in FIGS. 1A-1B, and similar detailed description is omitted for brevity. In some embodiments, conductor 322a corresponds to a word line WL0, and conductor 322c corresponds to a word line WL1.

In some embodiments, conductor 322b corresponds to a dummy word line Dummy WL, and conductor 322dc corresponds to another dummy word line Dummy WL.

Integrated circuit 300B further comprises a set of bit lines BL and a set of vias 338.

In comparison with integrated circuit 200, the set of vias 338 replaces the set of vias 238, and similar detailed description is omitted for brevity.

The set of vias 338 includes one or more of vias 338a, . . . , 338f. Each via of the set of vias 338 is similar to via 238a, and similar detailed description is omitted for brevity.

The set of bit lines BL includes bit line BL0, BL1 and BL2.

The set of bit lines BL extend in the second direction Y, and overlap a corresponding column of tiles.

Each tile includes a bit cell that corresponds to integrated circuit 100A, and similar detailed description is omitted for brevity.

Tile 302[1,1] includes efuse Rfuse coupled between bit line BL0 and NMOS transistor N0.

Tile 304[1,2] includes efuse Rfuse coupled between bit line BL1 and NMOS transistor N0.

Tile 302[1,3] includes efuse Rfuse coupled between bit line BL2 and NMOS transistor N0.

Tile 302[2,1] includes efuse Rfuse coupled between bit line BL0 and NMOS transistor N0.

Tile 304[2,2] includes efuse Rfuse coupled between bit line BL1 and NMOS transistor N0.

Tile 302[2,3] includes efuse Rfuse coupled between bit line BL2 and NMOS transistor N0.

Conductor 322a overlaps tiles 302[1,1], 304[1,2] and 302[1,3].

Conductor 322b overlaps tiles 302[1,1], 304[2,2] and 302[1,3].

Conductor 322c overlaps tiles 302[2,1], 304[2,2] and 302[2,3].

Conductor 322d overlaps tiles 302[2,1], 304[2,3] and 302[2,3].

Conductor 322a electrically couples the gates of NMOS transistor N0 in tiles 302[1,1], 304[1,2] and 302[1,3] by a corresponding via 338a, 338c and 338e.

Conductor 322c electrically couples the gates of NMOS transistor N0 in tiles 302[2,1], 304[2,2] and 302[2,3] by a corresponding via 338b, 338d and 338f.

In some embodiments, conductor 322b is not electrically coupled to the bit cell in corresponding tiles 302[1,1], 304[2,2] and 302[1,3].

In some embodiments, conductor 322d is not electrically coupled to the bit cell in corresponding tiles 302[2,1], 304[2,3] and 302[2,3].

In some embodiments, integrated circuit 300B achieves one or more of the benefits discussed herein.

Other materials, configurations, arrangements on other layout levels or quantities of elements in integrated circuit 300B are within the scope of the present disclosure.

Figure 3C:
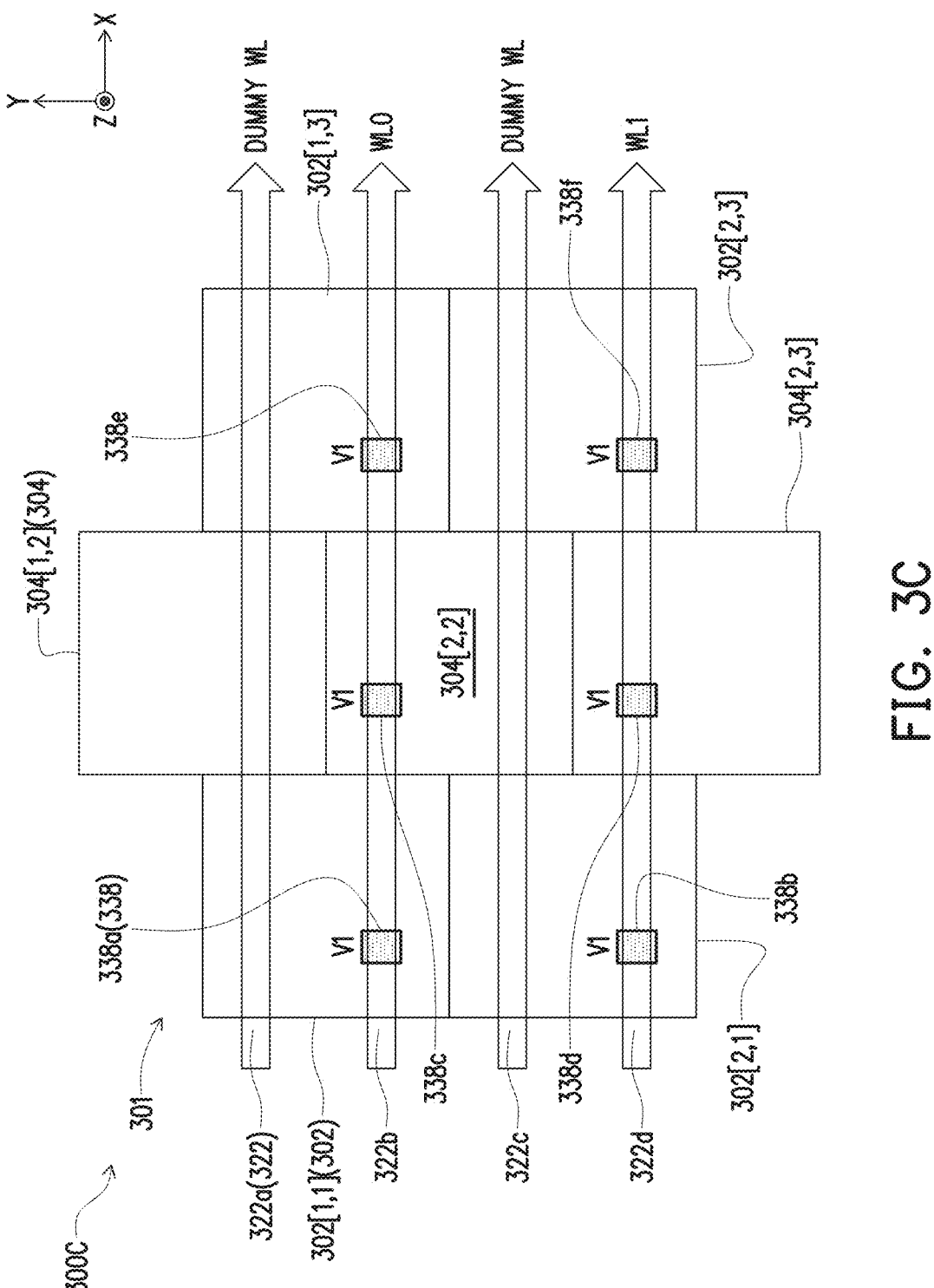
FIG. 3C is a diagram of a top view of an integrated circuit, in accordance with some embodiments.

FIG. 3C is a diagram of a top view of an integrated circuit 300C, in accordance with some embodiments.

Integrated circuit 300C is an embodiment of integrated circuit 300A, and similar detailed description is omitted for brevity.

Integrated circuit 300C is a variation of integrated circuit 300B, and similar detailed description is therefore omitted.

Integrated circuit 300C comprises the array of tiles 301, the set of conductors 322 and the set of vias 338.

In comparison with integrated circuit 300B, conductor 322a corresponds to a dummy word line Dummy WL, conductor 322b corresponds to word line WL0 in FIGS. 1A-1B, conductor 322c corresponds to another dummy word line Dummy WL, and conductor 322d corresponds to a word line WL1, and similar detailed description is omitted for brevity.

In some embodiments, integrated circuit 300C achieves one or more of the benefits discussed herein.

Other materials, configurations, arrangements on other layout levels or quantities of elements in integrated circuit 300C are within the scope of the present disclosure.

Figure 4:
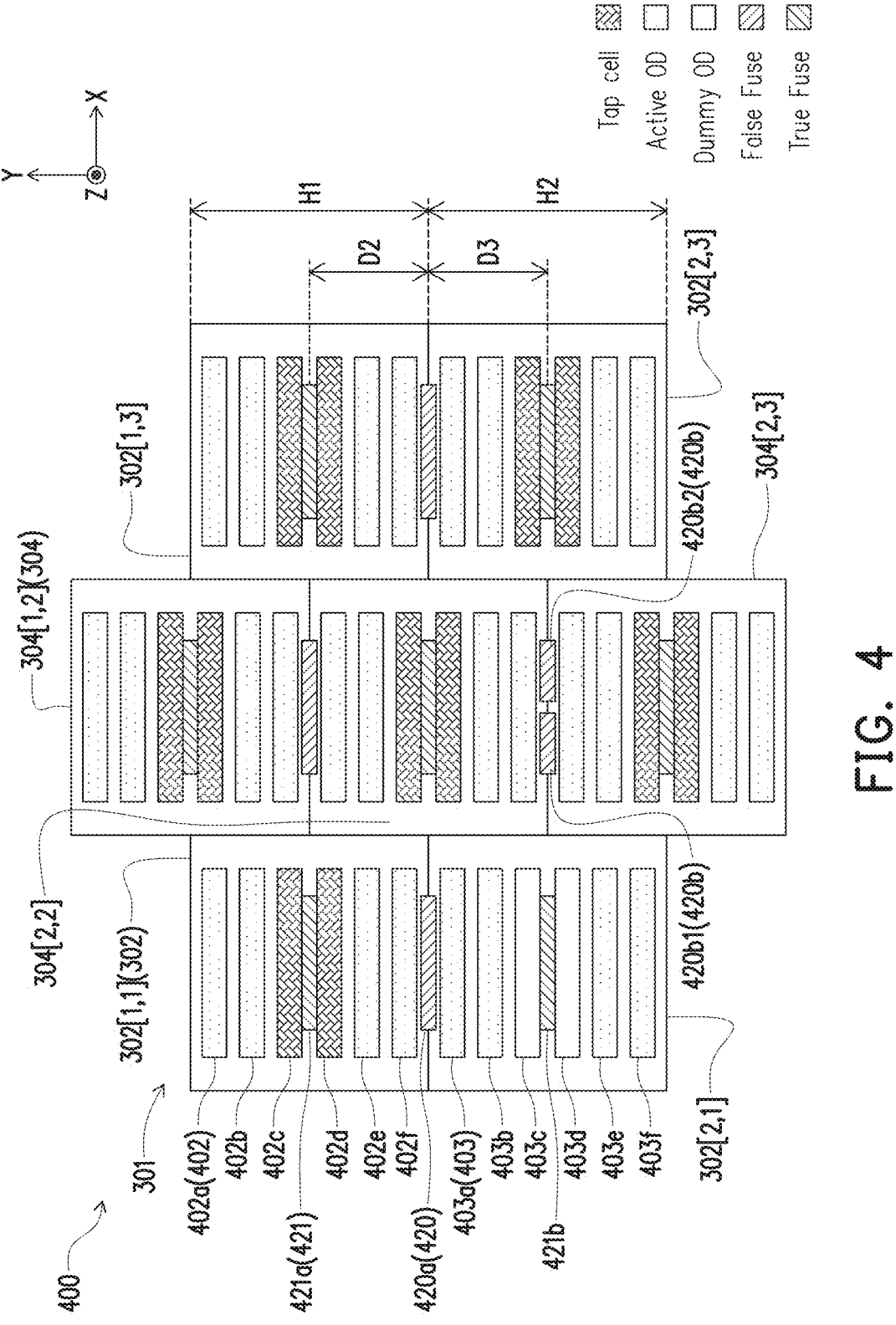
FIG. 4 is a diagram of a top view of an integrated circuit, in accordance with some embodiments.

FIG. 4 is a diagram of a top view of an integrated circuit 400, in accordance with some embodiments.

Integrated circuit 400 is an embodiment of at least integrated circuit 300A, 300B or 300C, and similar detailed description is omitted for brevity.

Integrated circuit 400 comprises the array of tiles 301.

Each of tile 302[1,1], 304[1,2], 304[2,2], 304[2,3], 302[1,3] and 302[2,3] in the array of tiles 301 comprises a set of active regions 402, a set of conductors 420 and a set of conductors 421.

Tile 302[2,1] in the array of tiles 301 comprises a set of active regions 403, the set of conductors 420 and the set of conductors 421.

Tile 304[2,2] or 304[2,3] in the array of tiles 301 is a variation of at least one of tiles 302[1,1], 304[1,2], 302[1,3] and 302[2,3]. For example, tile 304[2,2] or 304[2,3] includes conductor 420b instead of conductor 420a, and similar detailed description is omitted for brevity.

In some embodiments, at least the set of active regions 402 is similar to at least the set of active regions 202 or 203 of FIGS. 2A-2F, and similar detailed description is omitted for brevity.

In some embodiments, at least the set of active regions 403 is similar to at least the set of active regions 202 or 203 of FIGS. 2A-2F, and similar detailed description is omitted for brevity.

In some embodiments, at least the set of conductors 420 is similar to at least the set of conductors 220 of FIGS. 2A-2F, and similar detailed description is omitted for brevity.

In some embodiments, at least the set of conductors 421 is similar to at least the set of conductors 221 of FIGS. 2A-2F, and similar detailed description is omitted for brevity.

The set of active regions 402 includes one or more of active regions 402a, 402b, 402c, 402d, 402e or 402f. In some embodiments, at least one of active regions 402a, 402b, 402c, 402d, 402e or 402f is similar to at least one or more of active regions 202a, . . . , 202e of FIGS. 2A-2F, or at least one or more of active regions 203a, . . . , 203e of FIGS. 2A-2F, and similar detailed description is omitted for brevity.

In some embodiments, each of active region 402a, 402b, 402e and 402f is a corresponding active region of a corresponding active transistor (such as NMOS transistor N0 or PMOS transistor). In some embodiments, an active transistor is a functional transistor.

In some embodiments, each of active region 402c and 402d is a corresponding active region of a corresponding tap cell of the set of tap cells 204 or 205.

Other number of tap cells or other number of active regions of active transistors in the set of active regions 402 are within the scope of the present disclosure.

The set of active regions 403 includes one or more of active regions 403a, 403b, 403c, 403d, 403e or 403f. In some embodiments, at least one of active regions 403a, 403b, 403c, 403d, 403e or 403f is similar to at least one or more of active regions 202a, . . . , 202e of FIGS. 2A-2F or at least one or more of active regions 203a, . . . , 203e of FIGS. 2A-2F, and similar detailed description is omitted for brevity.

In some embodiments, each of active region 403a, 403b, 403e and 403f is a corresponding active region of a corresponding transistor (such as NMOS transistor N0 or PMOS transistor).

In some embodiments, each of active region 403c and 403d is a corresponding active region of a corresponding dummy transistor.

Other number of active regions of dummy transistors or other number of active regions of active transistors in the set of active regions 403 are within the scope of the present disclosure.

Other configurations, arrangements on other layout levels or quantities of active regions in the set of active regions 402 or 403 are within the scope of the present disclosure.

The set of conductors 420 includes one or more of conductors 420a or 420b.

In some embodiments, at least one of conductors 420a or 420b is similar to at least one of conductors 220a or 220b of FIGS. 2A-2F, and similar detailed description is omitted for brevity. In some embodiments, at least one of conductors 420a or 420b is a corresponding dummy fuse.

In some embodiments, conductor 420a corresponds to a single continuous conductive structure, and conductor 420a is configured as a dummy fuse that is associated with a "low resistance state".

In some embodiments, conductor 420b includes conductors 420b1 and 420b2. Each of conductor 420b1 and 420b2 are aligned with each other in the first direction X. In some embodiments, conductors 420b1 and 420b2 are separated from each other in the first direction X, and are not part of an integral or single continuous conductive structure, and conductor 420b is configured as a dummy fuse that is associated with a "high resistance state." In some embodiments, conductors 420b1 and 420b2 are not electrically coupled to each other in the "high resistance state."

The set of conductors 421 includes one or more of conductors 421a or 421b.

In some embodiments, at least conductor 421a is similar to at least conductor 221a of FIGS. 2A-2F, and similar detailed description is omitted for brevity. In some embodiments, conductor 421a is a corresponding true fuse.

In some embodiments, conductor 421a corresponds to a single continuous conductive structure, and conductor 421a is configured as a fuse with a "low resistance state".

Other resistance states for the set of conductors 420 or 421 are within the scope of the present disclosure.

At least one of tile 302[1,1], 304[1,2], 304[2,2] or 302 [1,3] has a height H1 in the second direction Y.

At least one of tile 302[2,1], 304[2,2], 304[2,3] or 302 [2,3] has a height H2 in the second direction Y.

In some embodiments, the height H1 is the same as the height H2. In some embodiments, the height H1 is greater than the height H2. In some embodiments, the height H1 is less than the height H2.

A center of conductor 421a is separated from a center of conductor 420a in the second direction Y by a distance D4. A center of conductor 420a is separated from a center of conductor 421b in the second direction Y by a distance D5.

A center of conductor 421a in tile 302[1,3] is separated from a center of conductor 420a in tile 302[1,3] or 302[2,3] in the second direction Y by a distance D4.

A center of conductor 421a in tile 302[2,3] is separated from a center of conductor 420a in tile 302[1,3] or 302[2,3] in the second direction Y by a distance D5.

A center of conductor 421a in tile 304[1,2] is separated from a center of conductor 420a in tile 304[1,2] or 304[2,2] in the second direction Y by a distance D4.

A center of conductor 421a in tile 304[2,2] is separated from a center of conductor 420a in tile 304[1,2] or 304[2,2] in the second direction Y by a distance D5.

A center of conductor 421a in tile 304[2,2] is separated from a center of conductor 420a in tile 304[2,2] or 304[2,3] in the second direction Y by a distance D4.

A center of conductor 421a in tile 304[2,3] is separated from a center of conductor 420a in tile 304[2,2] or 304[2,3] in the second direction Y by a distance D5.

In some embodiments, the distance D4 is the same as the distance D5. In some embodiments, the distance D4 is greater than the distance D5. In some embodiments, the distance D4 is less than the distance D5.

Other configurations, arrangements on other layout levels or quantities of conductors in the set of conductors 420 or 421 are within the scope of the present disclosure.

In some embodiments, integrated circuit 400 achieves one or more of the benefits discussed herein.

Other materials, configurations, arrangements on other layout levels or quantities of elements in integrated circuit 400 are within the scope of the present disclosure.

Figure 5:
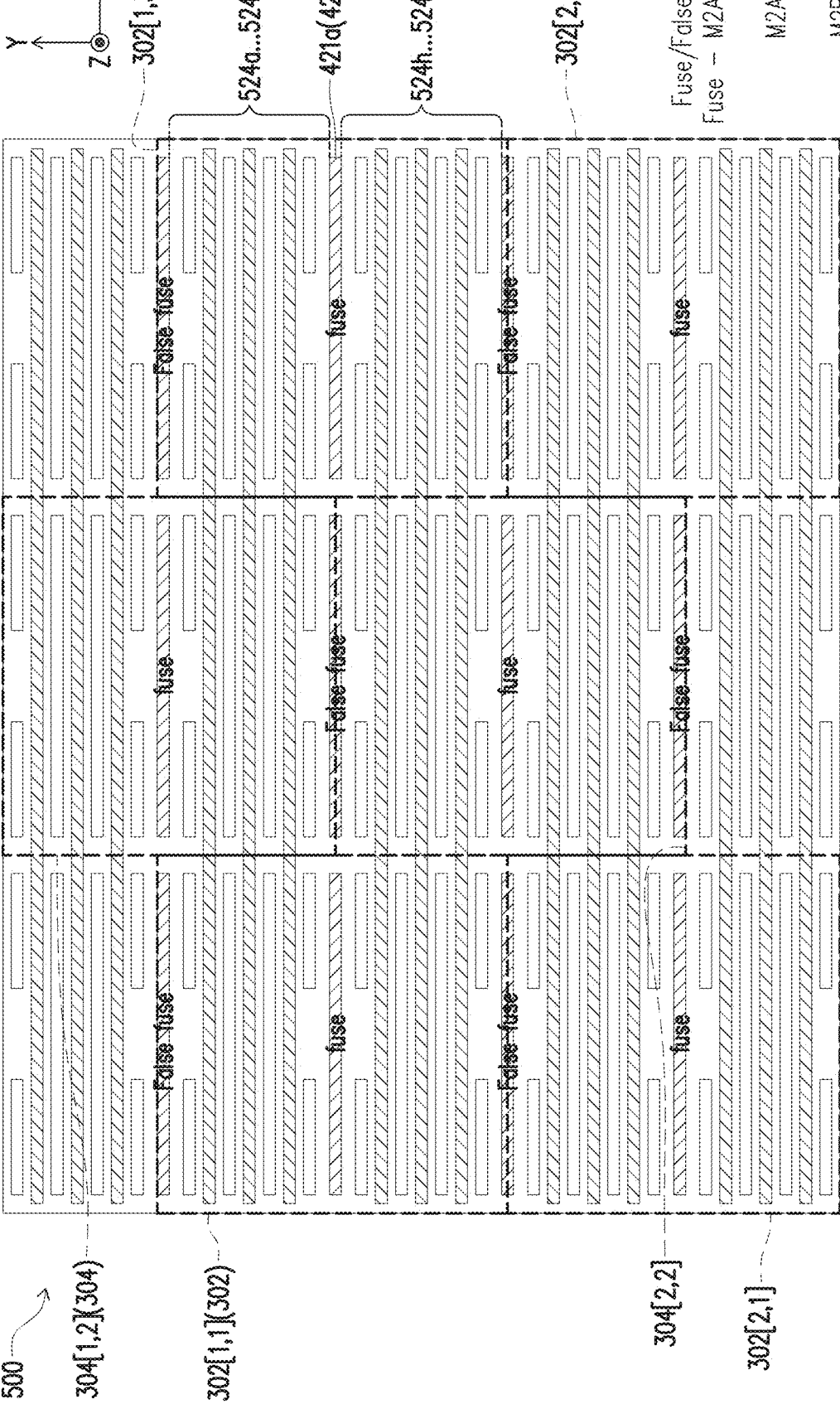
FIG. 5 is a diagram of a top view of an integrated circuit, in accordance with some embodiments.

FIG. 5 is a diagram of a top view of an integrated circuit 500, in accordance with some embodiments.

Integrated circuit 500 is a variation of integrated circuit 400, and similar detailed description is omitted for brevity. For example, in comparison with FIG. 4, integrated circuit 500 shows regular M2 conductive structures formed by a corresponding layout design.

Integrated circuit 500 is an embodiment of at least integrated circuit 300A, 300B or 300C, and similar detailed description is omitted for brevity.

Integrated circuit 500 comprises the array of tiles 301.

Each of tile 302[1,1], 302[1,2], 304[1,2], 304[2,2], 304 [2,3], 302[1,3] and 302[2,3] in the array of tiles 301 comprises a set of conductors 524 and the set of conductors 421.

In some embodiments, at least the set of conductors 524 is similar to at least the set of conductors 224 of FIGS. 2A-2F, and similar detailed description is omitted for brevity.

The set of conductors 524 includes one or more of conductors 524a, 524b, 524c, . . . , 524n.

In some embodiments, at least one of conductors 524a, 524b, 524c, . . . , 524n is similar to at least one of conductors 224a, 224b, 224c, . . . , 224m or 224n of FIGS. 2A-2F, and similar detailed description is omitted for brevity.

Other configurations, arrangements on other layout levels or quantities of conductors in the set of conductors 420, 421 or 524 are within the scope of the present disclosure. For example, in some embodiments, the set of conductors 420, 421 or 524 is on at least one of the M0 level, the M1 level, the M3 level, the M4 level, the M5 level and so forth.

In some embodiments, integrated circuit 500 achieves one or more of the benefits discussed herein.

Other materials, configurations, arrangements on other layout levels or quantities of elements in integrated circuit 500 are within the scope of the present disclosure.

Figure 6A:
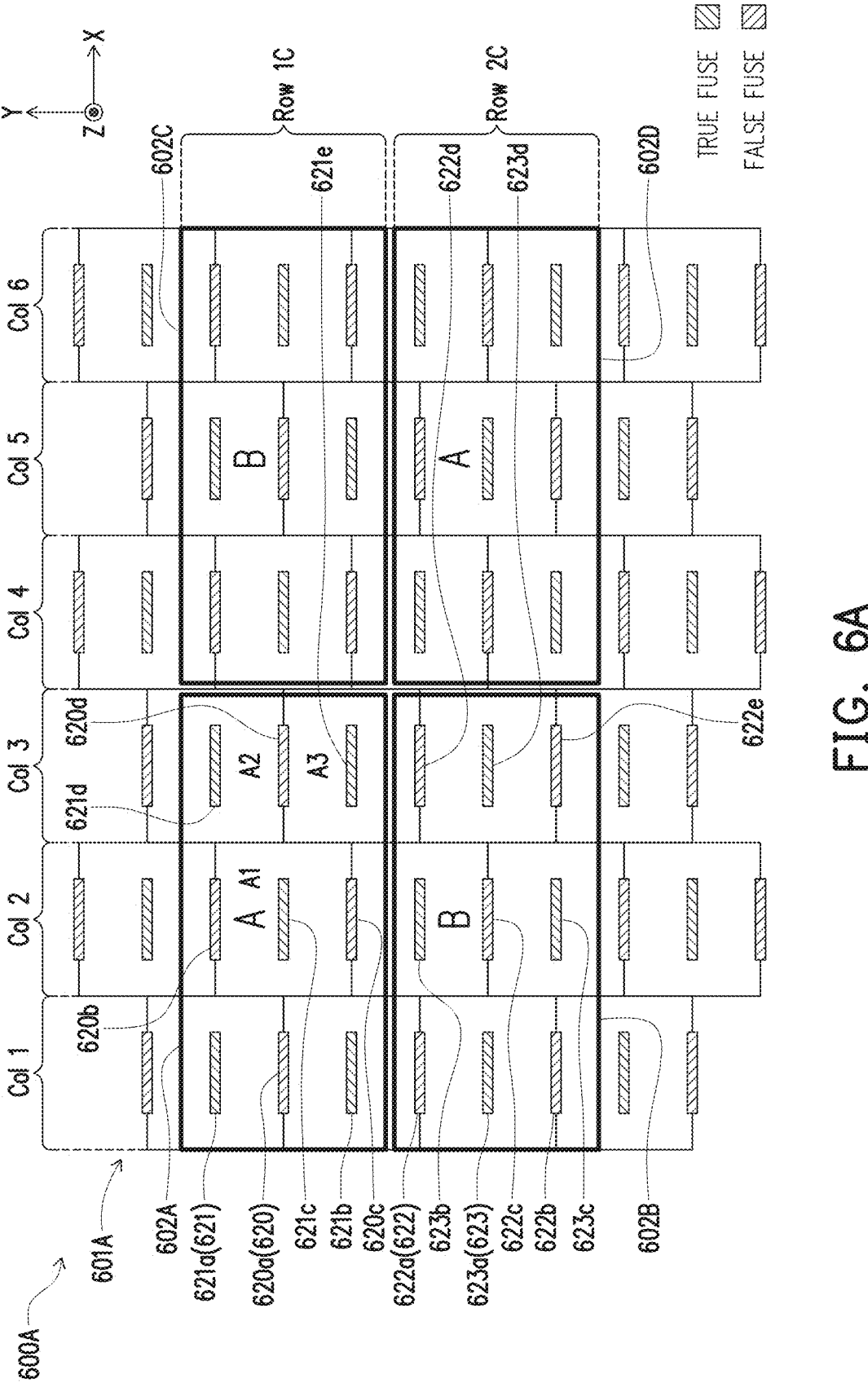
FIGS. 6A-6B are a corresponding diagram of a top view of corresponding integrated circuit, in accordance with some embodiments.
Figure 6B:
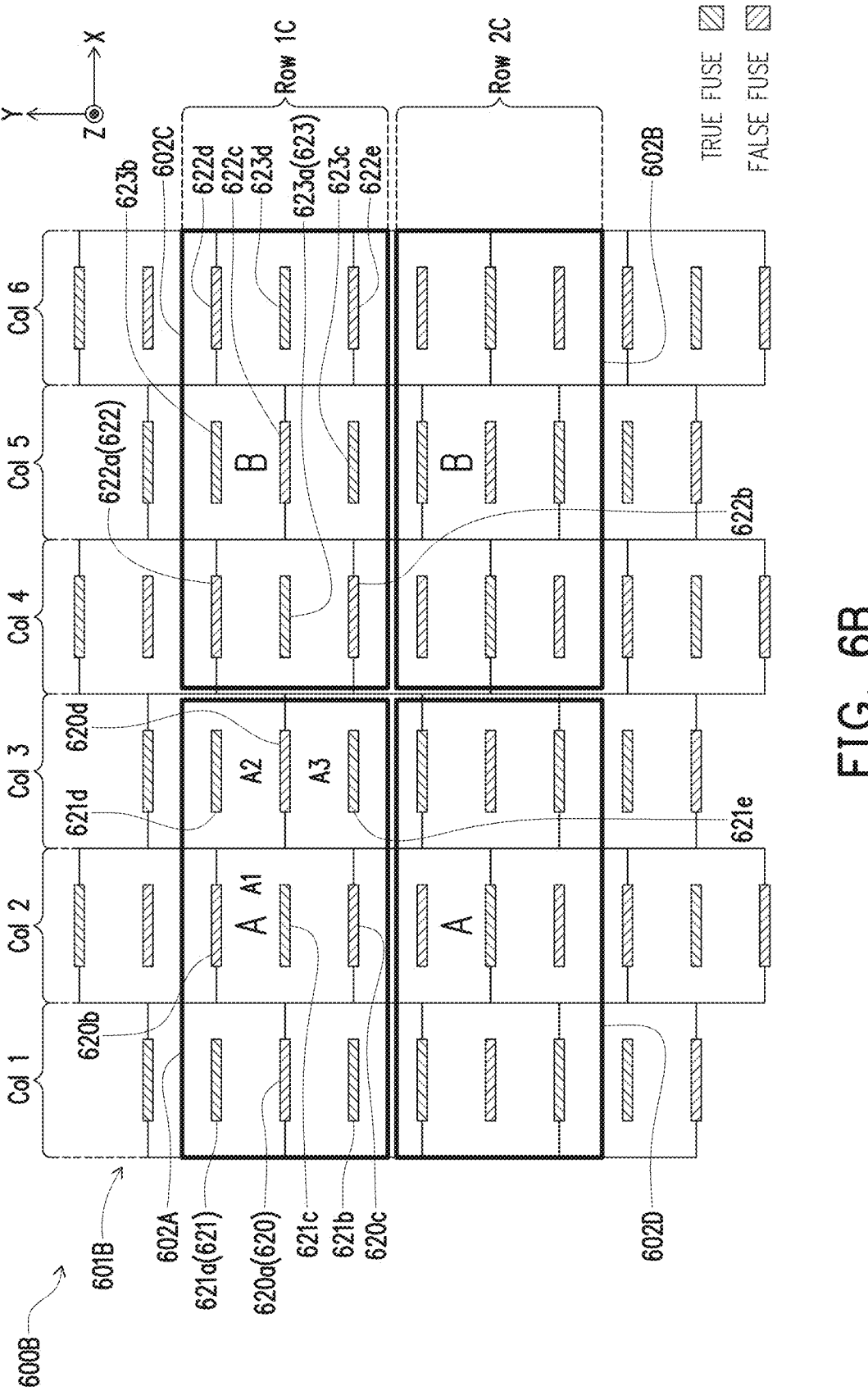

FIGS. 6A-6B are a corresponding diagram of a top view of corresponding integrated circuit 600A-600B, in accordance with some embodiments.

FIG. 6A is a diagram of a top view of an integrated circuit 600A, in accordance with some embodiments.

Integrated circuit 600A is a variation of at least integrated circuit 300A, 300B or 300C, and similar detailed description is omitted for brevity. For example, integrated circuit 600A shows regions of fuses and dummy fuses or tiles that are grouped together into Group A and Group B.

Integrated circuit 600A comprises an array of tiles 601A. In some embodiments, the array of tiles 601A is similar to array of tiles 301 of FIGS. 3A-3C, 4 and 5, and similar detailed description is omitted for brevity.

The array of tiles 601A includes an array of tiles 602A, 602B, 602C and 602D. At least one or more tiles in the array of tiles 602A or 602D includes a number of fuses in the set of conductors 621, and a number of dummy fuses in the set of conductors 620. At least one or more tiles in the array of tiles 602B or 602C includes a number of fuses in the set of conductors 623, and a number of dummy fuses in the set of conductors 622. For example, a first region of fuses/dummy fuses are grouped together into group A, and a second region of fuses/dummy fuses are grouped together into group B.

Group A includes 5 fuses and 4 dummy fuses. Other numbers of dummy fuses or other numbers of fuses in Group A are within the scope of the present disclosure. Other resistance states for dummy fuses or fuses in Group A are within the scope of the present disclosure.

The set of conductors 621 includes one or more of conductors 621a, 621b, . . . , 621e.

In some embodiments, at least one or more of conductors 621a, 621b, . . . , 621e is similar to at least conductor 221a of FIGS. 2A-2F, and similar detailed description is omitted for brevity. In some embodiments, one or more of conductors 621a, 621b, . . . , 621e is a corresponding true fuse in Group A.

The set of conductors 620 includes one or more of conductors 620a, 620b, . . . , 620d.

In some embodiments, at least one or more of conductors 620a, 620b, . . . , 620d is similar to at least conductor 220a or 220b of FIGS. 2A-2F, and similar detailed description is omitted for brevity. In some embodiments, one or more of conductors 620a, 620b, . . . , 620d is a corresponding dummy fuse in Group A.

Group B includes 4 fuses and 5 dummy fuses. Other number of dummy fuses or other number of fuses in Group B are within the scope of the present disclosure. Other resistance states for dummy fuses or fuses in Group B are within the scope of the present disclosure.

The set of conductors 623 includes one or more of conductors 623a, 623b, . . . , 623d.

In some embodiments, at least one or more of conductors 623a, 623b, . . . , 623d is similar to at least conductor 221a of FIGS. 2A-2F, and similar detailed description is omitted for brevity. In some embodiments, one or more of conductors 623a, 623b, . . . , 623d is a corresponding true fuse in Group B.

The set of conductors 622 includes one or more of conductors 622a, 622b, . . . , 622e.

In some embodiments, at least one or more of conductors 622a, 622b, . . . , 622e is similar to at least conductor 220a or 220b of FIGS. 2A-2F, and similar detailed description is omitted for brevity. In some embodiments, one or more of conductors 622a, 622b, . . . , 622e is a corresponding dummy fuse in Group B.

In some embodiments, the sequence of Group A and Group B fuses/dummy fuses or tiles repeat in the first direction X and the second direction Y. For example, in some embodiments, an array of Group A and Group B fuses/ dummy fuses tiles repeat in the first direction X in the pattern A, B, A, B, A, B and so forth. For example, in some embodiments, an array of Group A and Group B fuses/ dummy fuses tiles repeat in the second direction Y in the pattern A, B, A, B, A, B and so forth in row 1C.

For example, in some embodiments, an array of Group A and Group B fuses/dummy fuses tiles repeat in the first direction X in the pattern B, A, B, A, B and so forth. For example, in some embodiments, an array of Group A and Group B fuses/dummy fuses tiles repeat in the second direction Y in the pattern B, A, B, A, B and so forth in row 1C.

Other number of rows or columns in array of tiles 601A, 602A, 602B, 602C or 602D are within the scope of the present disclosure.

Other configurations, arrangements on other layout levels or quantities of conductors in the set of conductors 620, 621, 622 or 623 are within the scope of the present disclosure.

In some embodiments, integrated circuit 600A achieves one or more of the benefits discussed herein.

Other materials, configurations, arrangements on other layout levels or quantities of elements in integrated circuit 600A are within the scope of the present disclosure.

FIG. 6B is a diagram of a top view of an integrated circuit 600B, in accordance with some embodiments.

Integrated circuit 600B is a variation of integrated circuit 600A, and similar detailed description is omitted for brevity. In comparison with integrated circuit 600A, the positions of Group A and Group B in the second row (e.g., Row 2C) are switched.

Integrated circuit 600B is a variation of at least integrated circuit 300A, 300B or 300C, and similar detailed description is omitted for brevity. For example, integrated circuit 600B shows regions of fuses and dummy fuses or tiles that are grouped together into Group A and Group B.

Integrated circuit 600B comprises an array of tiles 601B. The array of tiles 601B includes the array of tiles 602A, 602B, 602C and 602D. In some embodiments, the array of tiles 602B is similar to array of tiles 301 of FIGS. 3A-3C, 4 and 5 or array of tiles 602A of FIG. 6A, and similar detailed description is omitted for brevity.

In some embodiments, the sequence of Group A and Group B fuses/dummy fuses or tiles repeat in the first direction X and the second direction Y. For example, in some embodiments, an array of Group A and Group B fuses/ dummy fuses tiles repeat in the first direction X in the pattern A, B, A, B, A, B and so forth. For example, in some embodiments, an array of Group A and Group B fuses/ dummy fuses tiles repeat in the second direction Y in the pattern A, B, A, B, A, B and so forth in row 1C.

For example, in some embodiments, an array of Group A and Group B fuses/dummy fuses tiles repeat in the first direction X in the pattern A, B, A, B, A, B and so forth. For example, in some embodiments, an array of Group A and Group B fuses/dummy fuses tiles repeat in the second direction Y in the pattern A, B, A, B, A, B and so forth in row 2C.

Other number of rows or columns in array of tiles 601B, 602A, 602B, 602C or 602D are within the scope of the present disclosure.

Other configurations, arrangements on other layout levels or quantities of conductors in the set of conductors 620, 621, 622 or 623 are within the scope of the present disclosure.

In some embodiments, integrated circuit 600B achieves one or more of the benefits discussed herein.

Other materials, configurations, arrangements on other layout levels or quantities of elements in integrated circuit 600B are within the scope of the present disclosure.

Figure 7:
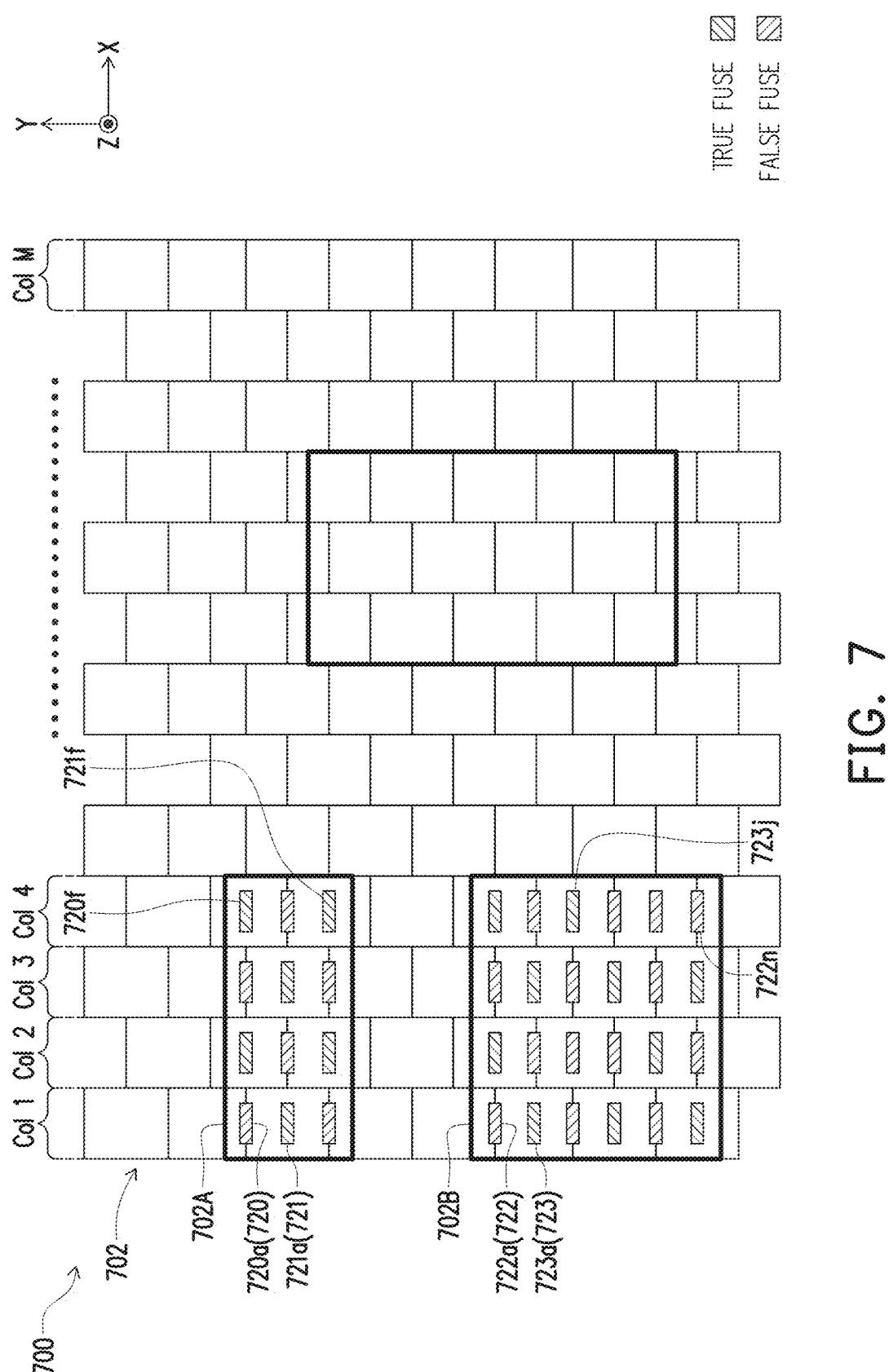
FIG. 7 is a corresponding diagram of a top view of corresponding integrated circuit, in accordance with some embodiments.

FIG. 7 is a corresponding diagram of a top view of corresponding integrated circuit 700, in accordance with some embodiments.

Integrated circuit 700 is a variation of at least integrated circuit 300A, 300B or 300C, and similar detailed description is omitted for brevity. For example, integrated circuit 700 shows fuses and dummy fuses grouped together into region 702A, and region 702B.

Integrated circuit 700 comprises an array of tiles 702. In some embodiments, the array of tiles 702 is similar to array of tiles 601A of FIG. 6A, array of tiles 601B of FIG. 6B, or array of tiles 301 of FIGS. 3A-3C, 4 and 5, and similar detailed description is omitted for brevity.

At least one or more tiles in the array of tiles 702 includes a number of fuses, and a number of dummy fuses.

Array of tiles 702 includes a region 702A. Region 702A includes a set of conductors 721, and a set of conductors 720.

The set of conductors 721 includes one or more of conductors 721a, 721b, . . . , 721f.

In some embodiments, at least one or more of conductors 721a, 721b, . . . , 721f is similar to at least conductor 221a of FIGS. 2A-2F, and similar detailed description is omitted for brevity. In some embodiments, one or more of conductors 721a, 721b, . . . , 721f is a corresponding true fuse in region 702A.

The set of conductors 720 includes one or more of conductors 720a, 720b, . . . , 720e.

In some embodiments, at least one or more of conductors 720a, 720b, . . . , 720e is similar to at least conductor 221a of FIGS. 2A-2F, and similar detailed description is omitted for brevity. In some embodiments, one or more of conductors 720a, 720b, . . . , 720e is a corresponding true fuse in region 702A.

Region 702A includes 6 fuses and 6 dummy fuses. Other numbers of dummy fuses or other numbers of fuses in region 702A are within the scope of the present disclosure. Other resistance states for dummy fuses or fuses in region 702A are within the scope of the present disclosure.

Array of tiles 702 further includes a region 702B. Region 702B includes a set of conductors 723, and a set of conductors 722.

The set of conductors 723 includes one or more of conductors 723a, 723b, . . . , 723j.

In some embodiments, at least one or more of conductors 723a, 723b, . . . , 723j is similar to at least conductor 221a of FIGS. 2A-2F, and similar detailed description is omitted for brevity. In some embodiments, one or more of conductors 723a, 723b, . . . , 723j is a corresponding true fuse in region 702B.

The set of conductors 722 includes one or more of conductors 722a, 722b, . . . , 722n.

In some embodiments, at least one or more of conductors 722a, 722b, . . . , 722n is similar to at least conductor 221a of FIGS. 2A-2F, and similar detailed description is omitted for brevity. In some embodiments, one or more of conductors 722a, 722b, . . . , 722n is a corresponding true fuse in region 702B.

Region 702B includes 10 fuses and 13 dummy fuses. Other numbers of dummy fuses or other numbers of fuses in region 702B are within the scope of the present disclosure. Other resistance states for dummy fuses or fuses in region 702B are within the scope of the present disclosure.

Other number of rows or columns in array of tiles 702 are within the scope of the present disclosure.

Other configurations, arrangements on other layout levels or quantities of conductors in the set of conductors 720, 721, 722 or 723 are within the scope of the present disclosure.

In some embodiments, integrated circuit 700 achieves one or more of the benefits discussed herein.

Other materials, configurations, arrangements on other layout levels or quantities of elements in integrated circuit 700 are within the scope of the present disclosure.

FIG. 8 is a functional flow chart of a method of manufacturing an IC device, in accordance with some embodiments. It is understood that additional operations may be performed before, during, and/or after the method 800 depicted in FIG. 8, and that some other processes may only be briefly described herein.

In some embodiments, other order of operations of method 800 is within the scope of the present disclosure. Method 800 includes exemplary operations, but the operations are not necessarily performed in the order shown. Operations may be combined, divided, added, replaced, changed order, and/or eliminated as appropriate, in accordance with the spirit and scope of disclosed embodiments. In some embodiments, one or more of the operations of at least method 800, 900 or 1000 is not performed.

In some embodiments, method 800 is an embodiment of operation 804 of method 900. In some embodiments, the method 800 is usable to manufacture or fabricate at least integrated circuit 200, 300A-300C, 400, 500, 600A-600B or 700, or an integrated circuit with similar features as at least layout design 100A-100B.

In some embodiments, other order of operations of methods 800 are within the scope of the present disclosure. Method 800 includes exemplary operations, but the operations are not necessarily performed in the order shown. Operations may be added, replaced, changed order, and/or eliminated as appropriate, in accordance with the spirit and scope of disclosed embodiments.

In operation 802 of method 800, a first set of transistors is fabricated in a first region (center A1 in FIG. 6A).

In some embodiments, the first set of transistors correspond to a first memory cell. In some embodiments, the first region extends in the first direction X.

In some embodiments, the first set of transistors include NMOS transistor N0, PMOS transistor P0, program device 280a or 280b.

In some embodiments, the first memory cell includes integrated circuit 100A or 100B.

In some embodiments, the first region corresponds to at least a tile of array of tiles 301, 602A, 602B or 702, or at least a tile in Group A or Group B of integrated circuit 600A, 600B or 700.

In some embodiments, the first region corresponds to region 702A or 702B.

In operation 804 of method 800, a second set of transistors is fabricated in a second.

In some embodiments, the second set of transistors correspond to a second memory cell. In some embodiments, the second region extends in the first direction X.

In some embodiments, the second set of transistors include NMOS transistor N0, PMOS transistor P0, program device 280a or 280b.

In some embodiments, the second memory cell includes integrated circuit 100A or 100B.

In some embodiments, the second region corresponds to at least a tile of array of tiles 301, 602A, 602B or 702, or at least a tile in Group A or Group B of integrated circuit 600A, 600B or 700.

In some embodiments, the second region corresponds to region 702A or 702B.

In some embodiments, at least operation 802a or 802b further includes forming a set of active regions of the first or second set of transistors is formed in a front-side of a substrate 290. In some embodiments, the first or second set of transistors of method 800 includes one or more transistors in the set of active regions 202. In some embodiments, the first or second set of transistors of method 800 includes one or more transistors described herein.

In some embodiments, the set of active regions of method 800 includes one or more regions similar to the set of active regions 202, 203, 402 or 403.

In some embodiments, at least operation 802a or 802b further includes fabricating source and drain regions of the set of transistors in a first well or second well.

In some embodiments, the first well comprises p-type dopants. In some embodiments, the p-dopants include boron, aluminum or other suitable p-type dopants. In some embodiments, the first well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the first well is formed by doping the substrate. In some embodiments, the doping is performed by ion implantation. In some embodiments, the first well has a dopant concentration ranging from $1\times10^{12}$ atoms/cm$^3$ to $1\times10^{14}$ atoms/cm$^3$. Other dopant concentrations are in the scope of the present disclosure.

In some embodiments, the first well comprises n-type dopants. In some embodiments, the n-type dopants include phosphorus, arsenic or other suitable n-type dopants. In some embodiments, the n-type dopant concentration ranges from about $1\times10^{12}$ atoms/cm$^2$ to about $1\times10^{14}$ atoms/cm$^2$. Other dopant concentrations are in the scope of the present disclosure.

In some embodiments, the second well comprises n-type dopants.

In some embodiments, the second well comprises an epi-layer grown over a substrate. In some embodiments, the epi-layer is doped by adding dopants during the epitaxial process. In some embodiments, the epi-layer is doped by ion implantation after the epi-layer is formed. In some embodiments, the second well is formed by doping the substrate. In some embodiments, the doping is performed by ion implantation. In some embodiments, the second well has a dopant concentration ranging from $1\times10^{12}$ atoms/cm$^3$ to $1\times10^{14}$ atoms/cm$^3$. Other dopant concentrations are in the scope of the present disclosure.

In some embodiments, the second well comprises p-type dopants.

Other dopant concentrations or types are in the scope of the present disclosure.

In some embodiments, the formation of the source/drain features includes, a portion of the substrate is removed to form recesses at an edge of spacers, and a filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as an STI region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate. In some embodiments, a portion of the first well is removed by an isotropic or an anisotropic etch process. The etch process selectively etches the first well without etching a gate structure and any spacers. In some embodiments, the etch process is performed using a reactive ion etch (RIE), wet etching, or other suitable techniques. In some embodiments, a semiconductor material is deposited in the recesses to form the source/drain features. In some embodiments, an epi process is performed to deposit the semiconductor material in the recesses. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate. In some embodiments, the source/drain features include epitaxially grown silicon (epi Si), silicon carbide, or silicon germanium. Source/drain features of the IC device associated with the gate structure are in-situ doped or undoped during the epi process in some instances. When source/drain features are undoped during the epi process, source/drain features are doped during a subsequent process in some instances. The subsequent doping process is achieved by an ion implantation, plasma immersion ion implantation, gas and/or solid source diffusion, other suitable processes, and/or combination thereof. In some embodiments, source/drain features are further exposed to annealing processes after forming source/drain features and/or after the subsequent doping process.

In some embodiments, at least operation 802a or 802b further includes fabricating a set of contacts on a first second level, the set of contacts extending in the second direction Y, and overlapping at least the first active region, the second active region.

In some embodiments, the set of contacts of method 800 includes one or more contacts patterns similar to at least the set of contacts 206.

In some embodiments, fabricating the set of contacts includes depositing a first conductive material over source/drain regions of the first or second set of transistors on an MD level.

In some embodiments, the source/drain regions of the first or second set of transistors of method 800 includes the source/drain regions of one or more transistors in the first or second set of active regions. In some embodiments, the set of contacts of method 800 includes features in the MD level.

In some embodiments, at least operation 802*a* or 802*b* further includes fabricating a set of gate structures on a POLY level.

In some embodiments, the set of gate structures extend in the second direction Y. In some embodiments, the set of gate structures include a first gate structure that overlaps at least the second active region and the third active region.

In some embodiments, the set of gates of method 800 includes gate regions that include the set of gates 270. In some embodiments, the second level of method 800 includes the POLY level.

In some embodiments, the gate region is between the drain region and the source region. In some embodiments, the gate region is over the first well and the substrate. In some embodiments, fabricating the gate regions includes performing one or more deposition processes to form one or more dielectric material layers. In some embodiments, a deposition process includes a chemical vapor deposition (CVD), a plasma enhanced CVD (PECVD), an atomic layer deposition (ALD), or other process suitable for depositing one or more material layers. In some embodiments, fabricating the gate regions includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, gate regions are formed using a doped or non-doped polycrystalline silicon (or polysilicon). In some embodiments, the gate regions include a metal, such as Al, Cu, W, Ti, Ta, TiN, TaN, NiSi, CoSi, other suitable conductive materials, or combinations thereof.

In operation 806 of method 800, a first set of vias and a second set of vias are formed.

In some embodiments, the first set of vias of method 800 are in the VD. In some embodiments, the first set of vias of method 800 includes at least the set of vias 230.

In some embodiments, the second set of vias of method 800 are in the VG level. In some embodiments, the second set of vias of method 800 includes vias in at least the VG level.

In some embodiments, the first set of vias are formed over the first set of contacts. In some embodiments, the second set of vias are formed over the set of gates.

In some embodiments, operation 810 includes forming a first and second set of self-aligned contacts (SACs) in the insulating layer over the front-side of the wafer. In some embodiments, the first and second set of vias are electrically coupled to at least the set of transistors.

In operation 808 of method 800, a first conductive material is deposited on a first level (M0 level) thereby forming a first set of conductors. In some embodiments, operation 808 includes at least depositing a first set of conductive regions over the front-side of the integrated circuit.

In some embodiments, the first set of conductors of method 800 includes one or more portions of at least the set of conductors 232.

In operation 810 of method 800, a third set of vias are formed. In some embodiments, the third set of vias of method 800 are in the V0 level. In some embodiments, the third set of vias of method 800 includes at least the set of vias 234. In some embodiments, the third set of vias are formed over at least the first set of conductors.

In some embodiments, operation 810 includes forming a first set of self-aligned contacts (SACs) in the insulating layer over the front-side of the wafer. In some embodiments, the third set of vias is electrically coupled to at least the first or second set of transistors.

In operation 812 of method 800, a second conductive material is deposited on a second level (M1 level) thereby forming a second set of conductors. In some embodiments, operation 812 includes at least depositing a second set of conductive regions over the front-side of the integrated circuit.

In some embodiments, the second set of conductors of method 800 includes one or more portions of at least the set of conductors 236.

In operation 814 of method 800, a fourth set of vias are formed. In some embodiments, the fourth set of vias of method 800 are in the V1 level. In some embodiments, the fourth set of vias of method 800 includes at least the set of vias 238 or 338. In some embodiments, the fourth set of vias are formed over at least the second set of conductors.

In some embodiments, operation 814 includes forming a second set of self-aligned contacts (SACs) in the insulating layer over the front-side of the wafer.

In operation 816 of method 800, a third conductive material is deposited on a third level (M2 level) thereby forming a first fuse and a first dummy fuse. In some embodiments, operation 812 includes at least depositing a third set of conductive regions over the front-side of the integrated circuit.

In some embodiments, the first fuse of method 800 includes one or more conductors of at least the set of conductors 221, 421, 621, 623, 721 or 723. In some embodiments, the first fuse of method 800 includes one or more conductors similar to at least conductors in the M2 layer.

In some embodiments, the first dummy fuse of method 800 includes one or more conductors of at least the set of conductors 220, 420, 620, 622, 720 or 722. In some embodiments, the first dummy fuse of method 800 includes one or more conductors similar to at least conductors in the M2 layer.

In operation 818 of method 800, a fourth conductive material is deposited on the third level (M2 level) thereby forming a second fuse and a second dummy fuse. In some embodiments, operation 812 includes at least depositing a third set of conductive regions over the front-side of the integrated circuit.

In some embodiments, the second fuse of method 800 includes one or more conductors of at least the set of conductors 221, 421, 621, 623, 721 or 723. In some embodiments, the second fuse of method 800 includes one or more conductors similar to at least conductors in the M2 layer.

In some embodiments, the second dummy fuse of method 800 includes one or more conductors of at least the set of conductors 220, 420, 620, 622, 720 or 722. In some embodiments, the second dummy fuse of method 800 includes one or more conductors similar to at least conductors in the M2 layer.

In operation 820 of method 800, a fifth conductive material is deposited on the third level (M2 level) thereby forming a first word line and a first dummy word line. In some embodiments, operation 812 includes at least depositing the third set of conductive regions over the front-side of the integrated circuit.

In some embodiments, the first word line of method 800 includes one or more conductors of at least the set of conductors 224, 322 or 524. In some embodiments, the first word line of method 800 includes one or more conductors similar to at least conductors in the M2 layer.

In some embodiments, the first dummy word line of method 800 includes one or more conductors of at least the set of conductors 224, 322 or 524. In some embodiments, the first dummy word line of method 800 includes one or more conductors similar to at least conductors in the M2 layer.

In some embodiments, at least one of the third, fourth, fifth or sixth conductive material is the same as another of at least one of the third, fourth or fifth conductive material.

In some embodiments, at least one of the third, fourth or fifth conductive material is different from another of at least one of the third, fourth, fifth or sixth conductive material.

In operation 822 of method 800, at least the first fuse, the second fuse, the first dummy fuse or the second dummy fuse is programmed.

In some embodiments, the first fuse, the second fuse, the first dummy fuse or the second dummy fuse is programmed by applying a program word line voltage and a bit line voltage sufficient to set the programming/resistance state of the first fuse, the second fuse, the first dummy fuse or the second dummy fuse.

In some embodiments, one or more of operations 802, 804, 806, 808, 810, 812, 814, 816, 818, 820 or 822 of method 800 include using a combination of photolithography and material removal processes to form openings in an insulating layer (not shown) over the substrate. In some embodiments, the photolithography process includes patterning a photoresist, such as a positive photoresist or a negative photoresist. In some embodiments, the photolithography process includes forming a hard mask, an antireflective structure, or another suitable photolithography structure. In some embodiments, the material removal process includes a wet etching process, a dry etching process, an RIE process, laser drilling or another suitable etching process. The openings are then filled with conductive material, e.g., copper, aluminum, titanium, nickel, tungsten, or other suitable conductive material. In some embodiments, the openings are filled using CVD, PVD, sputtering, ALD or other suitable formation process.

Figure 12:
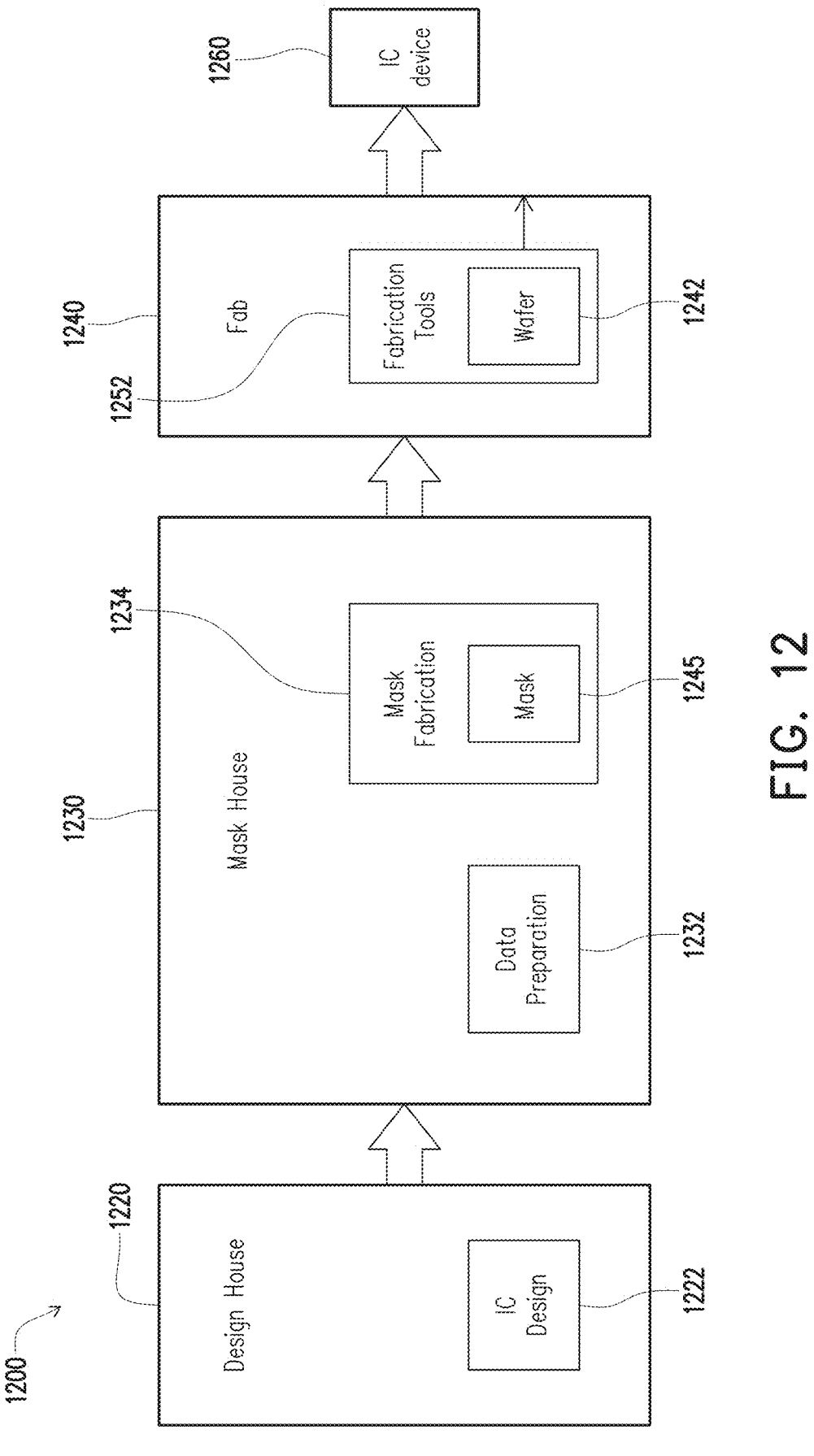
FIG. 12 is a block diagram of an IC manufacturing system, and an IC manufacturing flow associated therewith, in accordance with at least one embodiment of the present disclosure.

In some embodiments, at least one or more operations of method 800 is performed by system 1200 of FIG. 12. In some embodiments, at least one method(s), such as method 800 discussed above, is performed in whole or in part by at least one manufacturing system, including system 1200. One or more of the operations of method 800 is performed by IC fab 1240 (FIG. 12) to fabricate IC device 1260. In some embodiments, one or more of the operations of method 800 is performed by fabrication tools 1252 to fabricate wafer 1242.

In some embodiments, the conductive material includes copper, aluminum, titanium, nickel, tungsten, or other suitable conductive material. In some embodiments, the openings and trench are filled using CVD, PVD, sputtering, ALD or other suitable formation process. In some embodiments, after conductive material is deposited in one or more of operations 802, 804, 806, 808, 810, 812, 814, 816, 818, 820 or 822, the conductive material is planarized to provide a level surface for subsequent steps.

In some embodiments, one or more of the operations of method 800, 900 or 1000 is not performed.

One or more of the operations of methods 900-1000 is performed by a processing device configured to execute instructions for manufacturing an integrated circuit, such as at least integrated circuit 200, 300A-300C, 400, 500, 600A-600B or 700. In some embodiments, one or more operations of methods 900-1000 is performed using a same processing device as that used in a different one or more operations of methods 900-1000. In some embodiments, a different processing device is used to perform one or more operations of methods 900-1000 from that used to perform a different one or more operations of methods 900-1000. In some embodiments, other order of operations of method 800, 900 or 1000 is within the scope of the present disclosure. Method 800, 900 or 1000 includes exemplary operations, but the operations are not necessarily performed in the order shown. Operations in method 800, 900 or 1000 may be added, replaced, changed order, and/or eliminated as appropriate, in accordance with the spirit and scope of disclosed embodiments.

Figure 9:
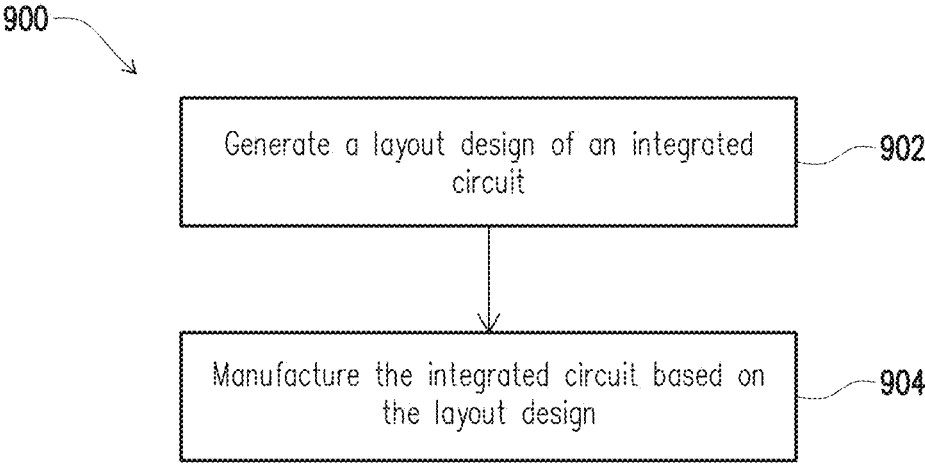
FIG. 9 is a flow chart of a method of manufacturing an IC device, in accordance with some embodiments.

FIG. 9 is a flowchart of a method 900 of forming or manufacturing an integrated circuit in accordance with some embodiments. It is understood that additional operations may be performed before, during, and/or after the method 900 depicted in FIG. 9, and that some other operations may only be briefly described herein. In some embodiments, the method 900 is usable to form integrated circuits, such as at least integrated circuit 200, 300A-300C, 400, 500, 600A-600B or 700.

In operation 902 of method 900, a layout design of an integrated circuit is generated. Operation 902 is performed by a processing device (e.g., processor 1102 (FIG. 11)) configured to execute instructions for generating a layout design. In some embodiments, the layout design of method 900 includes one or more patterns similar to one or more corresponding structures in at least integrated circuit 200, 300A-300C, 400, 500, 600A-600B or 700. In some embodiments, the layout design of the present application is in a graphic database system (GDSII) file format.

In operation 904 of method 900, the integrated circuit is manufactured based on the layout design. In some embodiments, operation 904 of method 900 comprises manufacturing at least one mask based on the layout design, and manufacturing the integrated circuit based on the at least one mask. In some embodiments, operation 904 is an embodiment of method 900.

FIG. 10 is a flowchart of a method 1000 of generating a layout design of an integrated circuit, in accordance with some embodiments. It is understood that additional operations may be performed before, during, and/or after the method 1000 depicted in FIG. 10, and that some other processes may only be briefly described herein. In some embodiments, method 1000 is an embodiment of operation 1002 of method 1000. In some embodiments, method 1000 is usable to generate one or more layout patterns similar to one or more features similar to at least integrated circuit 200, 300A-300C, 400, 500, 600A-600B or 700.

In some embodiments, method 1000 is usable to generate one or more layout patterns having structural relationships including alignment, lengths and widths, as well as configurations and layers of a layout design similar to one or more features similar to at least integrated circuit 200, 300A-300C, 400, 500, 600A-600B or 700, and similar detailed description will not be described in FIG. 10, for brevity.

In operation 1002 of method 1000, a set of active region patterns is generated or placed on the layout design. In some embodiments, the set of active region patterns of method 1000 includes one or more regions similar to the set of active regions 202, 203, 402 or 403.

In operation 1004 of method 1000, a set of gate patterns is generated or placed on the layout design. In some embodiments, the set of gate patterns of method 1000 includes one or more gate patterns similar to at least the set of gates 270.

In operation 1006 of method 1000, a set of contact patterns is generated or placed on the layout design. In some embodiments, the set of contact patterns of method 1000 includes one or more contact patterns similar to at least the set of contacts 206.

In operation 1008 of method 1000, a first set of via patterns and a second set of via patterns are generated or placed on the layout design. In some embodiments, the first set of via patterns of method 1000 includes one or more via patterns similar to at least the set of vias 230. In some embodiments, the first set of via patterns of method 1000 includes one or more vias similar to at least vias in the VD layer.

In some embodiments, the second set of via patterns of method 1000 includes one or more vias similar to at least vias in the VG layer.

In operation 1010 of method 1000, a first set of conductive patterns is generated or placed on the layout design. In some embodiments, the first set of conductive patterns of method 1000 includes one or more conductive feature patterns similar to at least the set of conductors 232.

In some embodiments, the first set of conductive patterns of method 1000 includes one or more conductors similar to at least conductors in the M0 layer.

In operation 1012 of method 1000, a third set of via patterns is generated or placed on the layout design. In some embodiments, the third set of via patterns of method 1000 includes one or more via patterns similar to at least the set of vias 234. In some embodiments, the third set of via patterns of method 1000 includes one or more vias similar to at least vias in the V0 layer.

In operation 1014 of method 1000, a second set of conductive patterns is generated or placed on the layout design. In some embodiments, the second set of conductive patterns of method 1000 includes one or more conductive feature patterns similar to at least the set of conductors 236. In some embodiments, the second set of conductive patterns of method 1000 includes one or more conductors similar to at least conductors in the M1 layer.

In operation 1016 of method 1000, a fourth set of via patterns is generated or placed on the layout design. In some embodiments, the fourth set of via patterns of method 1000 includes one or more via patterns similar to at least the set of vias 238 or 338. In some embodiments, the fourth set of via patterns of method 1000 includes one or more vias similar to at least vias in the V1 layer.

In operation 1018 of method 1000, a first fuse pattern and a first dummy fuse pattern is generated or placed on the layout design.

In some embodiments, the first fuse pattern of method 1000 includes one or more conductive feature patterns similar to at least the set of conductors 221, 421, 621, 623, 721 or 723. In some embodiments, the first fuse pattern of method 1000 includes one or more conductors similar to at least conductors in the M2 layer.

In some embodiments, the first dummy pattern of method 1000 includes one or more conductive feature patterns similar to at least the set of conductors 220, 420, 620, 622,

720 or 722. In some embodiments, the first fuse pattern of method 1000 includes one or more conductors similar to at least conductors in the M2 layer.

In operation 1020 of method 1000, a second fuse pattern and a second dummy fuse pattern is generated or placed on the layout design.

In some embodiments, the second fuse pattern of method 1000 includes one or more conductive feature patterns similar to at least the set of conductors 221, 421, 621, 623, 721 or 723. In some embodiments, the second fuse pattern of method 1000 includes one or more conductors similar to at least conductors in the M2 layer.

In some embodiments, the second dummy pattern of method 1000 includes one or more conductive feature patterns similar to at least the set of conductors 220, 420, 620, 622, 720 or 722. In some embodiments, the second fuse pattern of method 1000 includes one or more conductors similar to at least conductors in the M2 layer.

In operation 1022 of method 1000, a first word line pattern and a first dummy word line pattern is generated or placed on the layout design.

In some embodiments, the first word line pattern of method 1000 includes one or more conductive feature patterns similar to at least the set of conductors 224, 322 or 524. In some embodiments, the first word line pattern of method 1000 includes one or more conductors similar to at least conductors in the M2 layer.

In some embodiments, the first dummy word line pattern of method 1000 includes one or more conductive feature patterns similar to at least the set of conductors 224, 322 or 524. In some embodiments, the first dummy word line pattern of method 1000 includes one or more conductors similar to at least conductors in the M2 layer.

Figure 11:
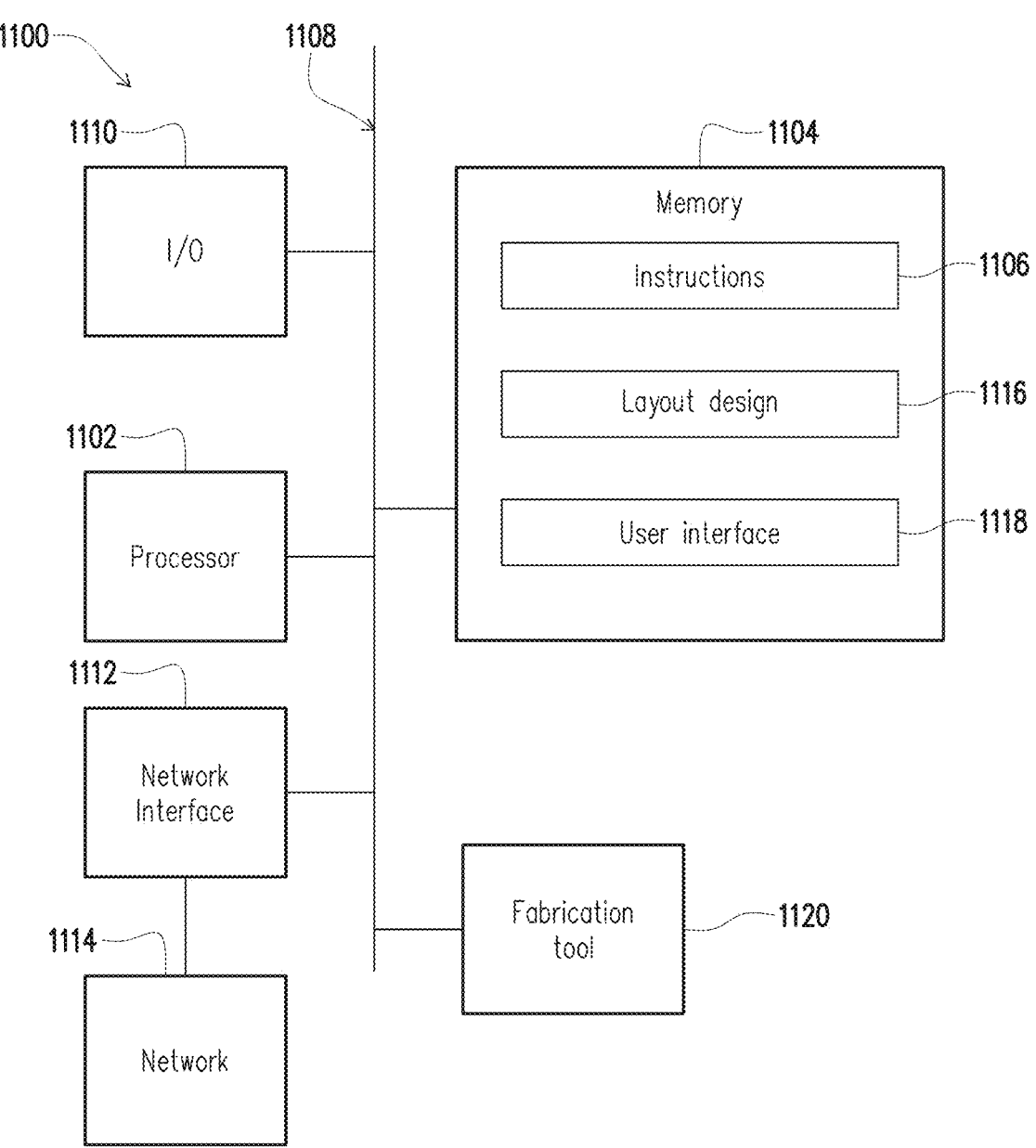
FIG. 11 is a schematic view of a system for designing an IC layout design and manufacturing an IC circuit in accordance with some embodiments.

FIG. 11 is a schematic view of a system 1100 for designing an IC layout design and manufacturing an IC circuit in accordance with some embodiments.

In some embodiments, system 1100 generates or places one or more IC layout designs described herein. System 1100 includes a hardware processor 1102 and a non-transitory, computer readable storage medium 1104 (e.g., memory 1104) encoded with, i.e., storing, the computer program code 1106, i.e., a set of executable instructions 1106. Computer readable storage medium 1104 is configured for interfacing with manufacturing machines for producing the integrated circuit.

The processor 1102 is electrically coupled to the computer readable storage medium 1104 via a bus 1108. The processor 1102 is also electrically coupled to an I/O interface 1110 by bus 1108. A network interface 1112 is also electrically connected to the processor 1102 via bus 1108. Network interface 1112 is connected to a network 1114, so that processor 1102 and computer readable storage medium 1104 are capable of connecting to external elements via network 1114. The processor 1102 is configured to execute the computer program code 1106 encoded in the computer readable storage medium 1104 in order to cause system 1100 to be usable for performing a portion or all of the operations as described in method 900-1000.

In some embodiments, the processor 1102 is a central processing unit (CPU), a multi-processor, a distributed processing system, an application specific integrated circuit (ASIC), and/or a suitable processing unit.

In some embodiments, the computer readable storage medium 1104 is an electronic, magnetic, optical, electro-magnetic, infrared, and/or a semiconductor system (or apparatus or device). For example, the computer readable storage medium 1104 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 1104 includes a compact disk-read only memory (CD-ROM), a compact disk-read/write (CD-R/W), and/or a digital video disc (DVD).

In some embodiments, the storage medium 1104 stores the computer program code 1106 configured to cause system 1100 to perform method 900-1000. In some embodiments, the storage medium 1104 also stores information needed for performing method 900-1000 as well as information generated during performing method 900-1000, such as layout design 1116, user interface 1118 and fabrication tool 1120, and/or a set of executable instructions to perform the operation of method 900-1000. In some embodiments, layout design 1116 comprises one or more layout patterns similar to corresponding structures in at least integrated circuit 200, 300A-300C, 400, 500, 600A-600B or 700.

In some embodiments, the storage medium 1104 stores instructions (e.g., computer program code 1106) for interfacing with manufacturing machines. The instructions (e.g., computer program code 1106) enable processor 1102 to generate manufacturing instructions readable by the manufacturing machines to effectively implement method 900-1000 during a manufacturing process.

System 1100 includes I/O interface 1110. I/O interface 1110 is coupled to external circuitry. In some embodiments, I/O interface 1110 includes a keyboard, keypad, mouse, trackball, trackpad, and/or cursor direction keys for communicating information and commands to processor 1102.

System 1100 also includes network interface 1112 coupled to the processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interface such as ETHERNET, USB, or IEEE-2094. In some embodiments, method 900-1000 is implemented in two or more systems 1100, and information such as layout design, and user interface are exchanged between different systems 1100 by network 1114.

System 1100 is configured to receive information related to a layout design through I/O interface 1110 or network interface 1112. The information is transferred to processor 1102 by bus 1108 to determine a layout design for producing at least integrated circuit 200, 300A-300C, 400, 500, 600A-600B or 700. The layout design is then stored in computer readable medium 1104 as layout design 1116. System 1100 is configured to receive information related to a user interface through I/O interface 1110 or network interface 1112. The information is stored in computer readable medium 1104 as user interface 1118. System 1100 is configured to receive information related to a fabrication tool 1120 through I/O interface 1110 or network interface 1112. The information is stored in computer readable medium 1104 as fabrication tool 1120. In some embodiments, the fabrication tool 1120 includes fabrication information utilized by system 1100. In some embodiments, the fabrication tool 1120 corresponds to mask fabrication 1234 of FIG. 12.

In some embodiments, method 900-1000 is implemented as a standalone software application for execution by a processor. In some embodiments, method 900-1000 is implemented as a software application that is a part of an additional software application. In some embodiments, method 900-1000 is implemented as a plug-in to a software application. In some embodiments, method 900-1000 is implemented as a software application that is a portion of an EDA tool. In some embodiments, method 900-1000 is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 900-1000 is implemented by a manufacturing device to manufacture an integrated circuit using a set of masks manufactured based on one or more layout designs generated by system 1100. In some embodiments, system 1100 is a manufacturing device configured to manufacture an integrated circuit using a set of masks manufactured based on one or more layout designs of the present disclosure. In some embodiments, system 1100 of FIG. 11 generates layout designs of an integrated circuit that are smaller than other approaches. In some embodiments, system 1100 of FIG. 11 generates layout designs of integrated circuit structure that occupy less area and provide better routing resources than other approaches.

FIG. 12 is a block diagram of an integrated circuit (IC) manufacturing system 1200, and an IC manufacturing flow associated therewith, in accordance with at least one embodiment of the present disclosure. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 (hereinafter "system 1200") includes entities, such as a design house 1220, a mask house 1230, and an IC manufacturer/fabricator ("fab") 1240, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, one or more of design house 1220, mask house 1230, and IC fab 1240 is owned by a single larger company. In some embodiments, one or more of design house 1220, mask house 1230, and IC fab 1240 coexist in a common facility and use common resources.

Design house (or design team) 1220 generates an IC design layout 1222. IC design layout 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout 1222 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout 1222. The design procedure includes one or more of logic design, physical design or place and route. IC design layout 1222 is presented in one or more data files having information of the geometrical patterns. For example, IC design layout 1222 can be expressed in a GDSII file format or DFII file format.

Mask house 1230 includes data preparation 1232 and mask fabrication 1234. Mask house 1230 uses IC design layout 1222 to manufacture one or more masks 1245 to be used for fabricating the various layers of IC device 1260 according to IC design layout 1222. Mask house 1230 performs mask data preparation 1232, where IC design layout 1222 is translated into a representative data file (RDF). Mask data preparation 1232 provides the RDF to mask fabrication 1234. Mask fabrication 1234 includes a mask writer. A mask writer converts the RDF to an image on a substrate, such as a mask (reticle) 1245 or a semiconductor wafer 1242. The design layout 1222 is manipulated by mask data preparation 1232 to comply with particular characteristics of the mask writer and/or requirements of IC fab 1240. In FIG. 12, mask data preparation 1232 and mask fabrication 1234 are illustrated as separate elements. In some embodiments, mask data preparation 1232 and mask fabrication 1234 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1234, which may undo part of the modifications performed by OPC in order to meet mask creation rules.

In some embodiments, mask data preparation 1232 includes lithography process checking (LPC) that simulates processing that will be implemented by IC fab 1240 to fabricate IC device 1260. LPC simulates this processing based on IC design layout 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1222.

It should be understood that the above description of mask data preparation 1232 has been simplified for the purposes of clarity. In some embodiments, data preparation 1232 includes additional features such as a logic operation (LOP) to modify the IC design layout according to manufacturing rules. Additionally, the processes applied to IC design layout 1222 during data preparation 1232 may be executed in a variety of different orders.

After mask data preparation 1232 and during mask fabrication 1234, a mask 1245 or a group of masks 1245 are fabricated based on the modified IC design layout 1222. In some embodiments, mask fabrication 1234 includes performing one or more lithographic exposures based on IC design 1222. In some embodiments, an electron-beam (e-beam) or a mechanism of multiple e-beams is used to form a pattern on a mask (photomask or reticle) 1245 based on the modified IC design layout 1222. The mask 1245 can be formed in various technologies. In some embodiments, the mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary version of mask 1245 includes a transparent substrate (e.g., fused quartz) and an opaque material (e.g., chromium) coated in the opaque regions of the binary mask. In another example, the mask 1245 is formed using a phase shift technology. In the phase shift mask (PSM) version of mask 1245, various features in the pattern formed on the mask are configured to have proper phase difference to enhance the resolution and imaging quality. In various examples, the phase shift mask can be attenuated PSM or alternating PSM. The mask(s) generated by mask fabrication 1234 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1240 is an IC fabrication entity that includes one or more manufacturing facilities for the fabrication of a variety of different IC products. In some embodiments, IC Fab 1240 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry entity.

IC fab 1240 includes wafer fabrication tools 1252 (hereinafter "fabrication tools 1252") configured to execute various manufacturing operations on semiconductor wafer 1242 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1240 uses mask(s) 1245 fabricated by mask house 1230 to fabricate IC device 1260. Thus, IC fab 1240 at least indirectly uses IC design layout 1222 to fabricate IC device 1260. In some embodiments, a semiconductor wafer 1242 is fabricated by IC fab 1240 using mask(s) 1245 to form IC device 1260. In some embodiments, the IC fabrication includes performing one or more lithographic exposures based at least indirectly on IC design 1222. Semiconductor wafer 1242 includes a silicon substrate or other proper substrate having material layers formed thereon. Semiconductor wafer 1242 further includes one or more of various doped regions, dielectric features, multilevel interconnects, and the like (formed at subsequent manufacturing steps).

System 1200 is shown as having design house 1220, mask house 1230 or IC fab 1240 as separate components or entities. However, it is understood that one or more of design house 1220, mask house 1230 or IC fab 1240 are part of the same component or entity.

One aspect of this description relates to an integrated circuit. In some embodiments, the integrated circuit includes a first active region, a second active region, a first fuse and a dummy fuse. The first active region extends in a first direction, and is on a first level. The second active region extends in the first direction, is on the first level, and is separated from the first active region in a second direction different from the first direction. The first fuse extends in the first direction, is on a second level, overlaps the first active region and is electrically coupled to the first active region. The dummy fuse extends in the first direction, is on the second level, and is separated from the first fuse in the second direction. The dummy fuse overlaps the second active region, and is not electrically coupled to the second active region.

Another aspect of this description relates to an integrated circuit. In some embodiments, the integrated circuit includes a first cell region corresponding to a first memory cell and a second cell region corresponding to a second memory cell In some embodiments, the first cell region extending in a first direction. In some embodiments, the second cell region extending in the first direction, and being adjacent to the first cell region. In some embodiments, the first cell region includes a first transistor. In some embodiments, the first cell region further includes a first fuse extending in the first direction, being on a first level, and being electrically coupled to the first transistor. In some embodiments, the first cell region further includes a first dummy fuse extending in the first direction, being on the first level, and being separated from the first fuse in a second direction different from the first direction, and the first dummy fuse not being electrically coupled to at least one transistor in the first cell region. In some embodiments, the second cell region includes a second transistor. In some embodiments, the second cell region further includes a second fuse extending in the first direction, being on the first level, and being electrically coupled to the second transistor. In some embodiments, the second cell region further includes a second dummy fuse extending in the first direction, being on the first level, and being separated from the second fuse in the second direction, the second dummy fuse not being electrically coupled to at least one transistor in the second cell region. In some embodiments, the second fuse is aligned with the first dummy fuse in the first direction.

Still another aspect of this description relates to a method of fabricating an integrated circuit. In some embodiments, the method includes fabricating a first set of transistors in a first region, the first set of transistors corresponding to a first memory cell, the first region extending in a first direction. In some embodiments, the method further includes fabricating a second set of transistors in a second region, the second set of transistors corresponding to a second memory cell, the second region extending in the first direction and being adjacent to the first region. In some embodiments, the method further includes depositing a first conductive material on a first level, thereby forming a first fuse and a first dummy fuse, the first fuse extending in the first direction, and being electrically coupled to at least a first transistor of the first set of transistors, and the first dummy fuse extending in the first direction, and being separated from the first fuse in a second direction different from the first direction, and the first dummy fuse not being electrically coupled to the first set of transistors. In some embodiments, the method further includes depositing a second conductive material on the first level, thereby forming a second fuse and a second dummy fuse, the second fuse extending in the first direction, and being electrically coupled to at least a first transistor of the second set of transistors, and the second dummy fuse extending in the first direction, and being separated from the second fuse in the second direction, and the second dummy fuse not being electrically coupled to the second set of transistors. In some embodiments, the method further includes depositing a third conductive material on the first level, thereby forming a first word line and a first dummy word line, the first word line extending in the first direction, and being electrically coupled to at least the first transistor of the first set of transistors and the first transistor of the second set of transistors, and the first dummy word line extending in the first direction, and being separated from the first word line in the second direction, and the first dummy word line not being electrically coupled to the second set of transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
a first active region extending in a first direction, and being on a first level;
a second active region extending in the first direction, being on the first level, and being separated from the first active region in a second direction different from the first direction;
a first fuse extending in the first direction, being on a second level, overlapping the first active region and being electrically coupled to the first active region; and
a dummy fuse extending in the first direction, being on the second level, and being separated from the first fuse in the second direction, the dummy fuse overlapping the second active region, and not being electrically coupled to the second active region.

2. The integrated circuit of claim 1, wherein
the first fuse corresponds to a first resistance of a first memory cell; and
the dummy fuse corresponds to a second resistance of a second memory cell, wherein the second memory cell is a dummy memory cell.

3. The integrated circuit of claim 2, further comprising:
a first word line extending in the first direction, being on the second level, being electrically coupled to a first transistor of the first memory cell, and being separated from the first fuse and the dummy fuse in the second direction; and a dummy word line extending in the first direction, being on the second level, being separated from the first fuse, and the dummy fuse and the first word line in the second direction.

4. The integrated circuit of claim 1, wherein
the first fuse is separated from the dummy fuse by a first distance in the second direction; and
a second fuse is separated from the dummy fuse by a second distance in the second direction.

5. The integrated circuit of claim 4, wherein the first distance is equal to the second distance.

6. The integrated circuit of claim 4, wherein the first distance is different than the second distance.

7. The integrated circuit of claim 1, wherein the first active region comprises:
a first tap cell coupled to a first voltage supply, the first tap cell comprising:
a first well region including a first dopant type; and
a first implant region including the first dopant type, and being configured to receive a first supply voltage from the first voltage supply.

8. The integrated circuit of claim 7, wherein the second active region comprises:
a second tap cell coupled to a second voltage supply different from the first voltage supply, the second tap cell comprising:
a second well region including a second dopant type different from the first dopant type; and
a second implant region including the second dopant type, and being configured to receive a second supply voltage from the second voltage supply.

9. The integrated circuit of claim 1, wherein the second active region comprises:
a set of non-functional transistors.

10. The integrated circuit of claim 1, wherein the second active region comprises:
a set of functional transistors.

11. An integrated circuit comprising:
a first cell region corresponding to a first memory cell, the first cell region extending in a first direction, the first cell region comprising:
a first transistor;
a first fuse extending in the first direction, being on a first level, and being electrically coupled to the first transistor; and
a first dummy fuse extending in the first direction, being on the first level, and being separated from the first fuse in a second direction different from the first direction, and the first dummy fuse not being electrically coupled to at least one transistor in the first cell region; and
a second cell region corresponding to a second memory cell, the second cell region extending in the first direction, and being adjacent to the first cell region, the second cell region comprising:
a second transistor;
a second fuse extending in the first direction, being on the first level, and being electrically coupled to the second transistor; and
a second dummy fuse extending in the first direction, being on the first level, and being separated from the second fuse in the second direction, the second dummy fuse not being electrically coupled to at least one transistor in the second cell region, wherein the second fuse is aligned with the first dummy fuse in the first direction.

12. The integrated circuit of claim 11, wherein
the first fuse overlaps a center of the first cell region,
the second fuse overlaps a center of the second cell region, and
the center of the second cell region is separated from the center of the first cell region in a third direction different from the first direction and the second direction.

13. The integrated circuit of claim 12, further comprising:
a third cell region corresponding to a third memory cell, the third cell region extending in the first direction, and being adjacent to the first cell region and the second cell region, the third cell region comprising:
a third transistor;
a third fuse extending in the first direction, being on the first level, and being electrically coupled to the third transistor; and
a third dummy fuse extending in the first direction, being on the first level, and being separated from the third fuse in the second direction, the third dummy fuse not being electrically coupled to at least one transistor in the third cell region;
wherein the third dummy fuse is aligned with the first fuse in the first direction.

14. The integrated circuit of claim 13, further comprising:
a fourth cell region corresponding to a fourth memory cell, the fourth cell region extending in the first direction, and being adjacent to the second cell region and the third cell region, the fourth cell region comprising:
a fourth transistor;
a fourth fuse extending in the first direction, being on the first level, and being electrically coupled to the fourth transistor; and
a fourth dummy fuse extending in the first direction, being on the first level, and being separated from the fourth fuse in the second direction, the fourth dummy fuse not being electrically coupled to at least one transistor in the fourth cell region;
wherein the fourth fuse is aligned with the first fuse and the third dummy fuse in the first direction.

15. The integrated circuit of claim 14, further comprising:
a first word line extending in the first direction, being on the first level, overlapping the first cell region, the second cell region and the fourth cell region, the first word line being electrically coupled to the first transistor of the first memory cell, the second transistor of the second memory cell and the fourth transistor of the fourth memory cell, and being between the first fuse and the first dummy fuse in the second direction;
a second word line extending in the first direction, being on the first level, overlapping the third cell region, and being electrically coupled to the third transistor of the third memory cell, and being separated from the first word line in the second direction; and
a first dummy word line extending in the first direction, being on the first level, overlapping the first cell region, the third cell region and the fourth cell region, and being between the first word line and the second word line.

16. The integrated circuit of claim 14, wherein
the first fuse corresponds to a resistance of the first memory cell;
the first dummy fuse corresponds to a resistance of a first non-functional memory cell;
the second fuse corresponds to a resistance of the second memory cell;
the second dummy fuse corresponds to a resistance of a second non-functional memory cell;

the third fuse corresponds to a resistance of the third memory cell;

the third dummy fuse corresponds to a resistance of a third non-functional memory cell;

the fourth fuse corresponds to a resistance of the fourth memory cell; and the fourth dummy fuse corresponds to a resistance of a fourth non-functional memory cell.

17. The integrated circuit of claim 11, wherein the first cell region has a first height in the second direction; and the second cell region has a second height in the second direction.

18. The integrated circuit of claim 17, wherein the first height is equal to the second height.

19. The integrated circuit of claim 17, wherein the first height is different from the second height.

20. A method of fabricating an integrated circuit, the method comprising:

fabricating a first set of transistors in a first region, the first set of transistors corresponding to a first memory cell, the first region extending in a first direction;

fabricating a second set of transistors in a second region, the second set of transistors corresponding to a second memory cell, the second region extending in the first direction and being adjacent to the first region;

depositing a first conductive material on a first level, thereby forming a first fuse and a first dummy fuse, the first fuse extending in the first direction, and being electrically coupled to at least a first transistor of the first set of transistors, and the first dummy fuse extending in the first direction, and being separated from the first fuse in a second direction different from the first direction, and the first dummy fuse not being electrically coupled to the first set of transistors;

depositing a second conductive material on the first level, thereby forming a second fuse and a second dummy fuse, the second fuse extending in the first direction, and being electrically coupled to at least a first transistor of the second set of transistors, and the second dummy fuse extending in the first direction, and being separated from the second fuse in the second direction, and the second dummy fuse not being electrically coupled to the second set of transistors; and depositing a third conductive material on the first level, thereby forming a first word line and a first dummy word line, the first word line extending in the first direction, and being electrically coupled to at least the first transistor of the first set of transistors and the first transistor of the second set of transistors, and the first dummy word line extending in the first direction, and being separated from the first word line in the second direction, and the first dummy word line not being electrically coupled to the second set of transistors.

* * * * *